(12) United States Patent
Lu

(10) Patent No.: US 12,183,622 B2
(45) Date of Patent: Dec. 31, 2024

(54) SEMICONDUCTOR STRUCTURE COMPRISING AN AIR CHAMBER AND METHOD OF MANUFACTURING THE SAME

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 367 days.

(21) Appl. No.: 17/652,338

(22) Filed: Feb. 24, 2022

(65) Prior Publication Data
US 2023/0047893 A1    Feb. 16, 2023

Related U.S. Application Data

(63) Continuation of application No. PCT/CN2021/116921, filed on Sep. 7, 2021.

(30) Foreign Application Priority Data

Aug. 11, 2021   (CN) .......................... 202110918051.2

(51) Int. Cl.
| | |
|---|---|
| *H01L 21/764* | (2006.01) |
| *H01L 21/762* | (2006.01) |
| *H10B 12/00* | (2023.01) |

(52) U.S. Cl.
CPC ...... *H01L 21/76224* (2013.01); *H01L 21/764* (2013.01); *H10B 12/053* (2023.02); *H10B 12/34* (2023.02); *H10B 12/488* (2023.02)

(58) Field of Classification Search
CPC ......... H01L 21/76264; H01L 21/76289; H01L 21/764; H01L 21/7682; H01L 29/4991;
(Continued)

(56) References Cited

U.S. PATENT DOCUMENTS

| | | | |
|---|---|---|---|
| 11,056,175 B1 | 7/2021 | Ikeda | |
| 2014/0291755 A1* | 10/2014 | Baek | ................... H01L 29/7827<br>257/334 |

(Continued)

FOREIGN PATENT DOCUMENTS

| | | |
|---|---|---|
| CN | 108063140 A | 5/2018 |
| CN | 111430348 A | 7/2020 |

(Continued)

OTHER PUBLICATIONS

International Search Report cited in PCT/CN2021/116921 mailed May 6, 2022, 8 pages.

*Primary Examiner* — Nicholas J Tobergte
*Assistant Examiner* — William Henry Anderson
(74) *Attorney, Agent, or Firm* — Syncoda LLC; Feng Ma

(57) ABSTRACT

The present disclosure provides a method of manufacturing a semiconductor structure and a semiconductor structure. The method of manufacturing a semiconductor structure includes: providing a base, wherein the base includes an active region and a shallow trench isolation structure separating the active region, a word line trench is formed in the base, and the word line trench exposes a part of the active region and the shallow trench isolation structure; forming a first intermediate structure in the word line trenches, wherein the first intermediate structure covers side walls and a bottom wall of the word line trench, a first trench is formed in the first intermediate structure, the first intermediate structure includes a sacrificial structure, and the sacrificial structure includes a horizontal portion; and removing the horizontal portion of the sacrificial structure, and closing the first trench, and forming an air chamber.

10 Claims, 27 Drawing Sheets

(58) Field of Classification Search
CPC ............. H01L 29/0649; H01L 29/0653; H01L 2229/1042; H01L 29/42336; H01L 29/42352; H01L 29/4236; H01L 29/66704; H01L 29/66734; H01L 29/7397; H01L 29/7813; H01L 29/7825; H01L 21/762–7621; H01L 21/76224; H01L 21/76229; H01L 21/76283; H01L 29/0642; H10B 12/34; H10B 12/488
See application file for complete search history.

(56) References Cited

U.S. PATENT DOCUMENTS

| | | | |
|---|---|---|---|
| 2016/0104798 A1* | 4/2016 | Kim | H10B 12/482 257/329 |
| 2016/0181377 A1* | 6/2016 | Oh | H01L 21/28568 438/421 |
| 2018/0145080 A1* | 5/2018 | Kim | H01L 29/4991 |
| 2020/0203351 A1 | 6/2020 | Chae et al. | |
| 2021/0242211 A1* | 8/2021 | Huang | H01L 21/76843 |
| 2022/0223601 A1* | 7/2022 | Lin | H10B 12/34 |

FOREIGN PATENT DOCUMENTS

| | | | |
|---|---|---|---|
| CN | 112885833 A | 6/2021 | |
| TW | I717173 B | 1/2021 | |

* cited by examiner

SEMICONDUCTOR STRUCTURE COMPRISING AN AIR CHAMBER AND METHOD OF MANUFACTURING THE SAME

CROSS-REFERENCE TO RELATED APPLICATIONS

This is a continuation of International Application No. PCT/CN2021/116921, filed on Sep. 7, 2021, which claims the priority to Chinese Patent Application 202110918051.2, titled "METHOD OF MANUFACTURING SEMICONDUCTOR STRUCTURE AND SEMICONDUCTOR STRUCTURE" and filed on Aug. 11, 2021. The entire contents of International Application No. PCT/CN2021/116921 and Chinese Patent Application 202110918051.2 are incorporated herein by reference.

TECHNICAL FIELD

The present disclosure relates to, but is not limited to, a method of manufacturing a semiconductor structure and a semiconductor structure.

BACKGROUND

A dynamic random access memory (DRAM) has advantages of a small volume, high integration, and low power consumption, and has faster read speed and write speed than a read-only memory (ROM).

The DRAM is composed of a plurality of repeated memory cells. Each memory cell usually includes a capacitor structure and a transistor. In the transistor, the gate is connected to a word line, the drain is connected to a bit line, and the source is connected to the capacitor structure. As the integration of the DRAM continuously increases, a spacing between word lines and a spacing between a word line and a bit line are becoming smaller. As a result, large parasitic capacitances are easily generated between the word lines and between the word line and the bit line, resulting in mutual interference between conducting wires, and affecting electrical performance of the DRAM.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor device, wherein the manufacturing method includes:

providing a base, wherein the base includes an active region and a shallow trench isolation structure separating the active region, a word line trench is formed in the base, and the word line trench exposes a part of the active region and the shallow trench isolation structure;

forming a first intermediate structure in the word line trench, wherein the first intermediate structure covers side walls and a bottom wall of the word line trench, a first trench is formed in the first intermediate structure, the first intermediate structure includes a sacrificial structure, and the sacrificial structure includes a horizontal portion; and removing the horizontal portion of the sacrificial structure, and closing the first trench, and forming an air chamber.

A second aspect of the present disclosure provides a semiconductor structure, wherein the semiconductor structure includes:

a base, wherein the base includes an active region and a shallow trench isolation structure separating the active region;

a word line trench, wherein the word line trench is formed in the base and intersects the active region and the shallow trench isolation structure; and a word line structure, wherein the word line structure is formed in the word line trench, the word line structure includes a conductive layer, a top isolation structure, and an air chamber, and the air chamber is provided between the conductive layer and the top isolation structure.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

Technical solutions in embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
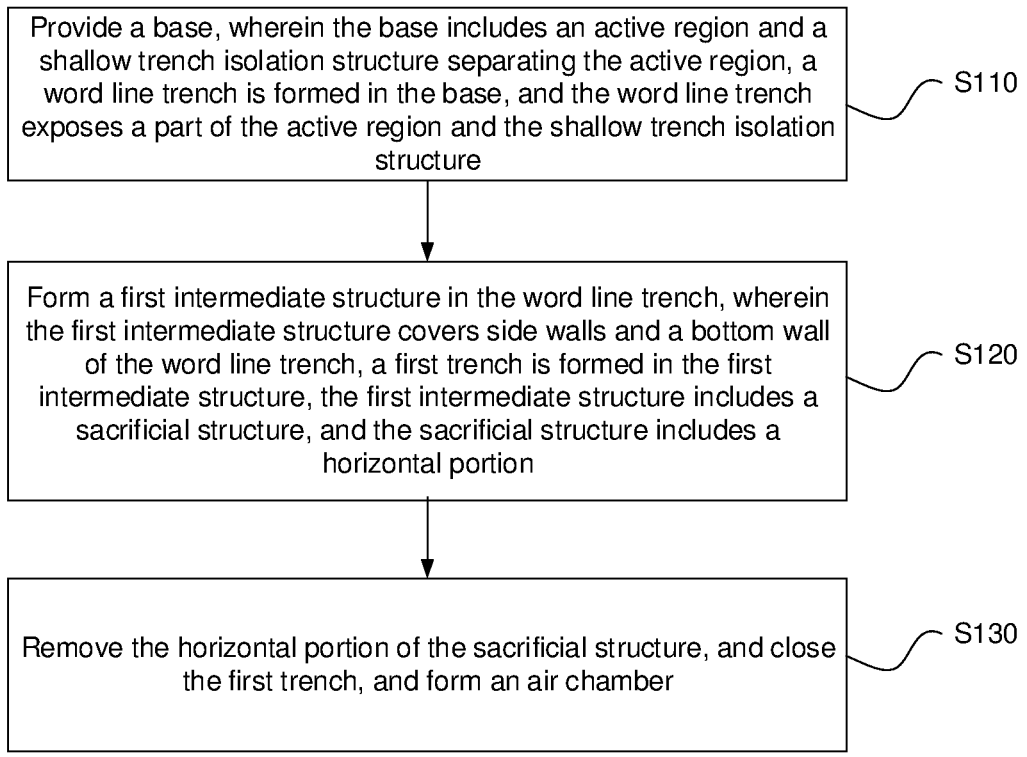
FIG. 1 is a flowchart of a method of manufacturing a semiconductor structure according to an exemplary embodiment.

An exemplary embodiment of the present disclosure provides a method of manufacturing a semiconductor structure, as shown in FIG. 1. FIG. 1 is a flowchart of a method of manufacturing a semiconductor structure according to an exemplary embodiment of the present disclosure. FIG. 6 to FIG. 38 are schematic diagrams of various stages of the method of manufacturing a semiconductor structure. The method of manufacturing a semiconductor structure is described below with reference to FIG. 6 to FIG. 38.

The semiconductor structure is not limited in this embodiment. The semiconductor structure is described below by taking a DRAM as an example, but this embodiment is not limited to this. Alternatively, the semiconductor structure in this embodiment may be other structures.

In the embodiments of the present disclosure, a direction X is an extension direction of an active region 110, and a direction Y is an extension direction of a word line trench 130.

As shown in FIG. 1, the method of manufacturing a semiconductor structure according to the exemplary embodiment of the present disclosure includes the following steps:

Step S110: Provide a base, wherein the base includes an active region and a shallow trench isolation structure separating the active region, a word line trench is formed in the base, and the word line trench exposes a part of the active region and the shallow trench isolation structure.

The providing a base 100 includes the following steps:

S111. Provide a substrate.

Figure 44:
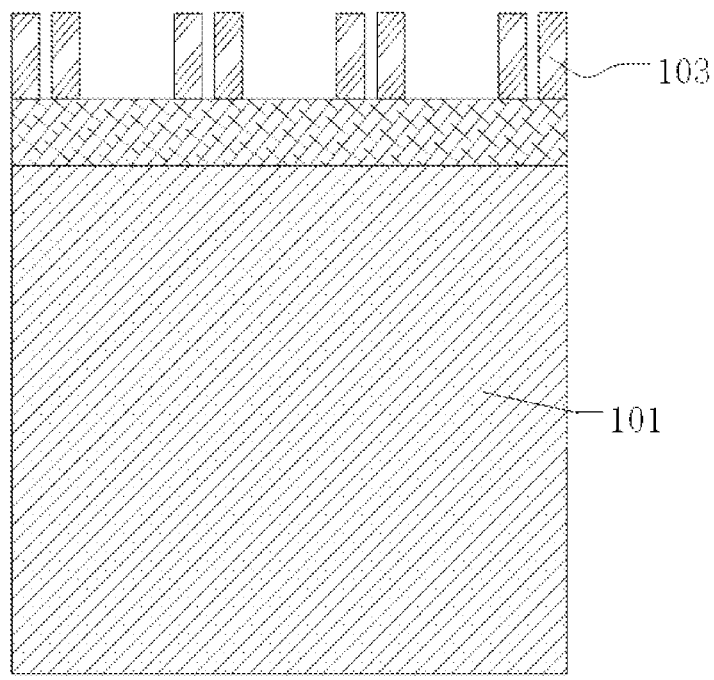
FIG. 44 is a schematic diagram of forming a photoresist mask layer on a top surface of a substrate in a method of manufacturing a semiconductor structure according to an exemplary embodiment.

As shown in FIG. 44, a substrate 101 may be made of a semiconductor material. For example, the semiconductor material may be one or more of silicon, germanium, a silicon-germanium compound, and a silicon-carbon compound.

S112. Etch the substrate to form shallow trenches in the substrate, wherein the shallow trenches separate the substrate into a plurality of active regions arranged in an array.

Figure 45:
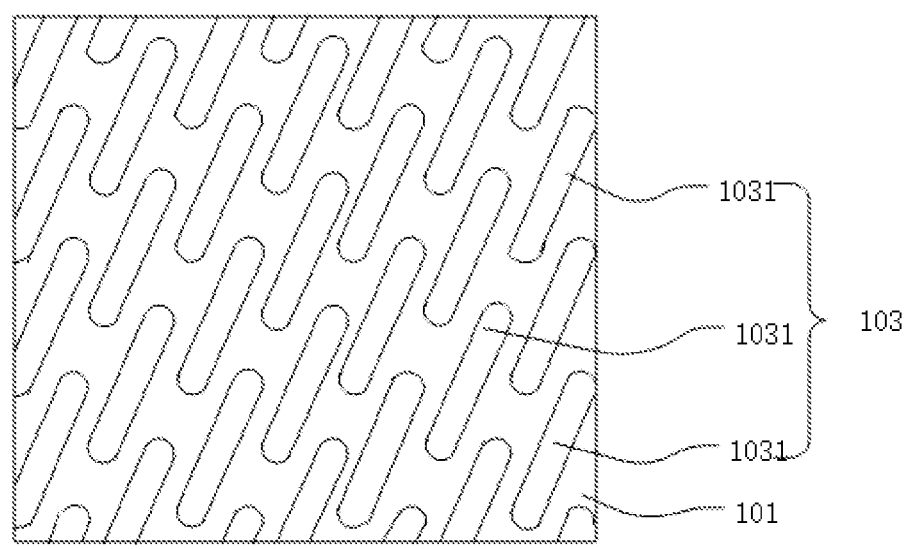
FIG. 45 is a schematic diagram of projection of a photoresist mask layer on a substrate in a method of manufacturing a semiconductor structure according to an exemplary embodiment.
Figure 46:
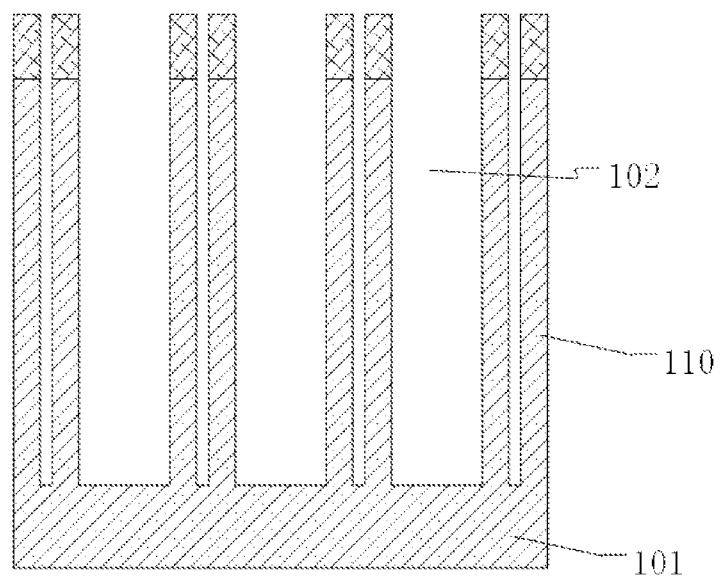
FIG. 46 is a schematic diagram of forming a shallow trench in a method of manufacturing a semiconductor structure according to an exemplary embodiment.

As shown in FIG. 45, referring to FIG. 44, a photoresist mask layer 103 is formed, and the photoresist mask layer 103 covers a part of a top surface of the substrate 101. As shown in FIG. 45, a projection of the photoresist mask layer 103 on the substrate 101 includes a plurality of independently arranged mask units 1031. A part of the substrate 101 exposed by the photoresist mask layer 103 is removed through dry or wet etching, as shown in FIG. 46, to form a shallow trench 102. The photoresist mask layer 103 is removed, a plurality of independently arranged active regions 110 are formed on the substrate 101 covered by the photoresist mask layer 103, and the plurality of active regions 110 are isolated by shallow trenches 102.

S113. Fill each of the shallow trenches to form a shallow trench isolation structure.

Figure 47:
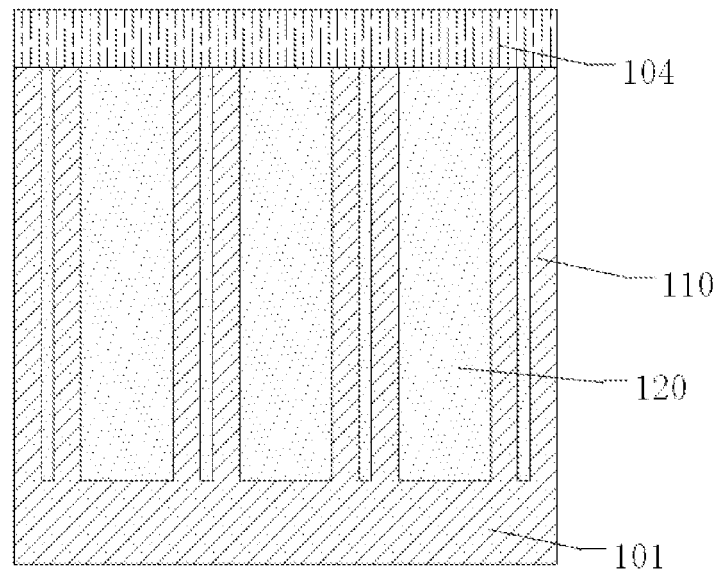
FIG. 47 is a schematic diagram of forming a shallow trench isolation structure in a method of manufacturing a semiconductor structure according to an exemplary embodiment.

As shown in FIG. 47, referring to FIG. 46, a deposition process is used in this embodiment, for example, a chemical vapor deposition process or an atomic layer deposition (ALD) process may be used, a low-k dielectric material is deposited to fill the shallow trench 102 to form a shallow trench isolation structure 120, and the shallow trench isolation structure 120 separates the plurality of active regions 110. In this embodiment, silicon oxide is deposited into the shallow trench 102 to form the shallow trench isolation structure 120 to separate the active region 110.

S114. Form a first mask layer.

Figure 48:
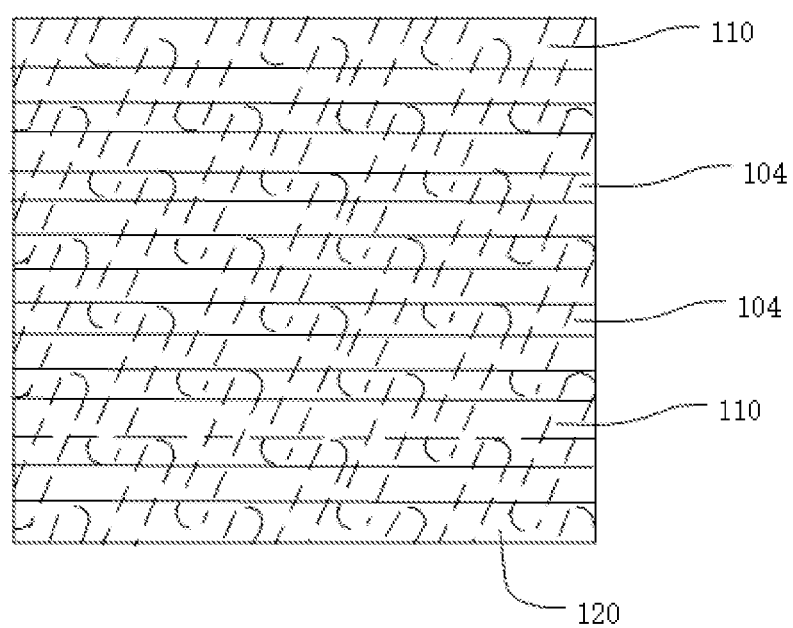
FIG. 48 is a schematic diagram of a projection of a first mask layer formed on a substrate in a method of manufacturing a semiconductor structure according to an exemplary embodiment.

As shown in FIG. 47, a first mask layer 104 is formed in the active region 110 and on a top surface of the shallow trench isolation structure 120. As shown in FIG. 48, a projection of the first mask layer 104 on the substrate 101 exposes a part of the active region 110 and a part of the shallow trench isolation structure 120.

S115. Partially remove the active region and the shallow trench isolation structure according to the first mask layer, and form the word line trench.

Figure 6:
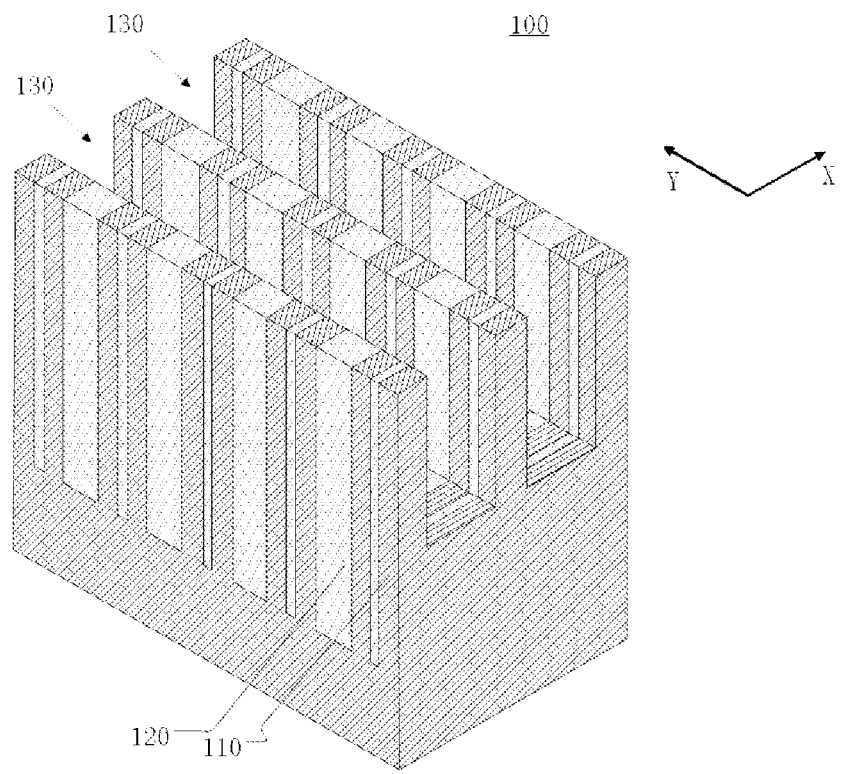
FIG. 6 is a schematic structural diagram of a base provided in a method of manufacturing a semiconductor structure according to an exemplary embodiment.

As shown in FIG. 6, the part of the active region 110 and the part of the shallow trench isolation structure 120 exposed by the first mask layer 104 are removed, to form the word line trench 130. A depth by which the active region 110 and the shallow trench isolation structure 120 are removed according to the first mask layer 104 is less than a depth of the shallow trench 102.

Figure 7:
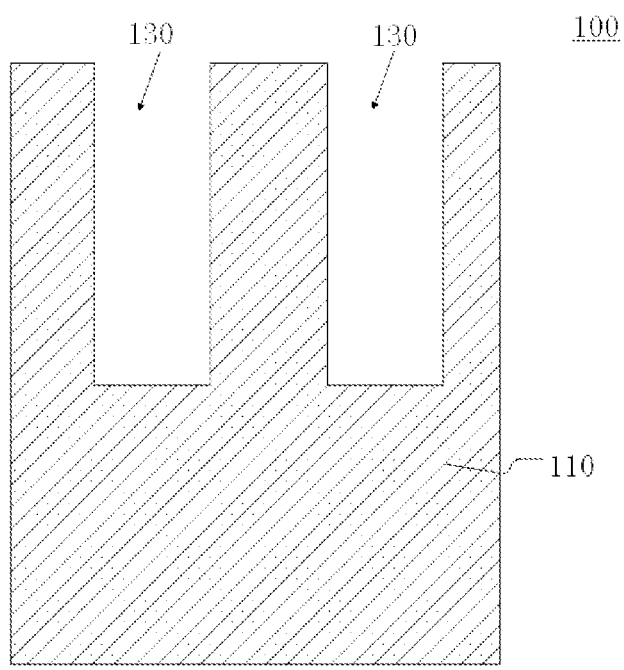
FIG. 7 is a schematic cross-sectional view of the base provided in FIG. 6 along a direction x.
Figure 8:
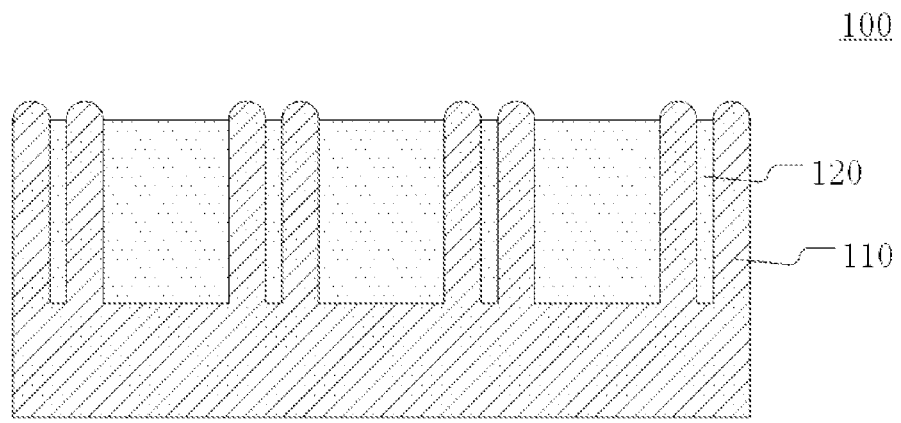
FIG. 8 is a schematic cross-sectional view of word line trenches of the base provided in FIG. 6 along a direction y.

As shown in FIG. 6, FIG. 7, FIG. 8, the base 100 includes the active regions 110 and the shallow trench isolation structures 120, wherein a plurality of active regions 110 are arranged in an array, and the shallow trench isolation structure 120 separates adjacent active regions 110. The shallow trench isolation structure 120 separates the active regions 110, and the adjacent active regions 110 are independent of each other, to avoid interference between the adjacent active regions 110.

Step S120: Form a first intermediate structure in the word line trench, wherein the first intermediate structure covers side walls and a bottom wall of the word line trench, a first trench is formed in the first intermediate structure, the first intermediate structure includes a sacrificial structure, and the sacrificial structure includes a horizontal portion.

Figure 28:
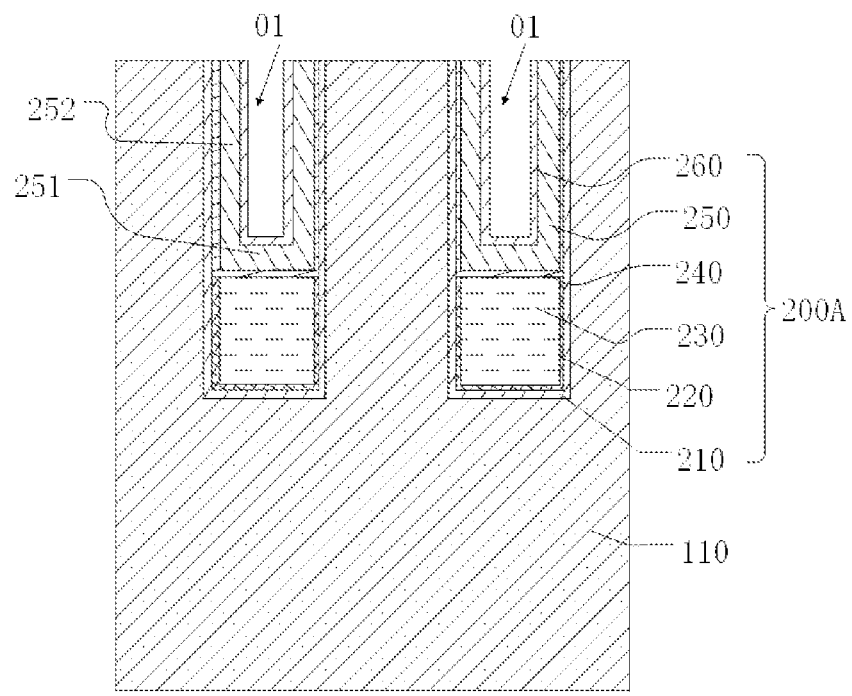
FIG. 28 is a schematic cross-sectional view of FIG. 27 along a direction x.
Figure 29:
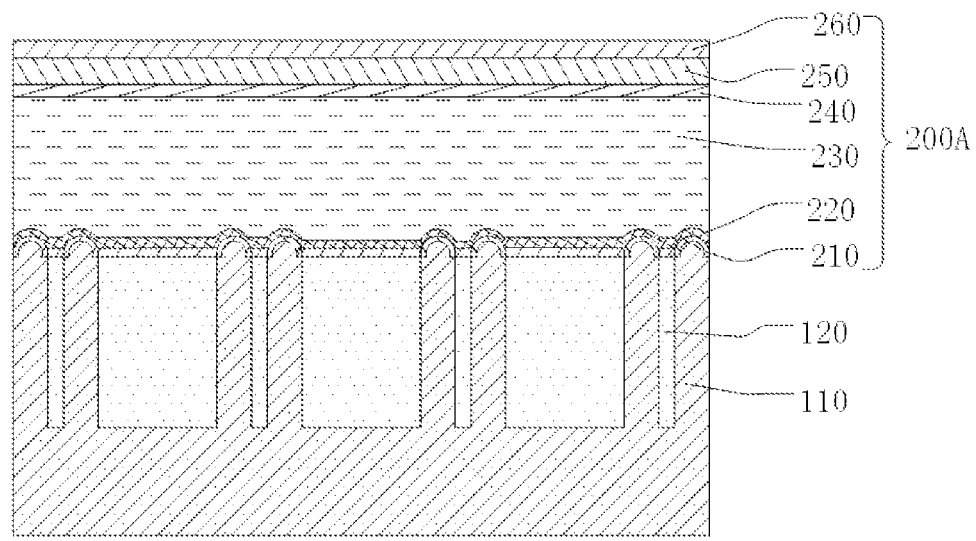
FIG. 29 is a schematic cross-sectional view of a first trench in FIG. 27 along a direction y.
Figure 30:
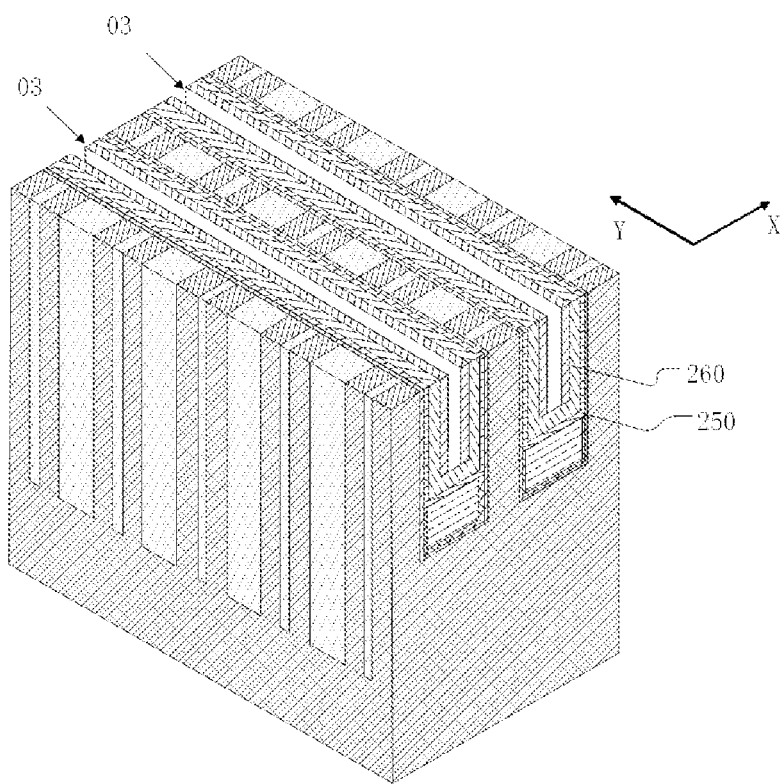
FIG. 30 is a schematic diagram of forming a third trench in a method of manufacturing a semiconductor structure according to an exemplary embodiment.

In this embodiment, as shown in FIG. 28, a first intermediate structure 200A is an intermediate process structure formed during the formation of a word line structure 200. Referring to FIG. 29 and FIG. 30, the first intermediate structure 200A is a laminated structure and includes a sacrificial structure 250, and the sacrificial structure 250 includes a horizontal portion 251. The first intermediate structure 200A forms a first trench 01 in the word line trench 130, and the horizontal portion 251 of the sacrificial structure 250 serves as a bottom wall of the first trench 01.

Step S130: Remove the horizontal portion of the sacrificial structure, and close the first trench, and form an air chamber.

Figure 33:
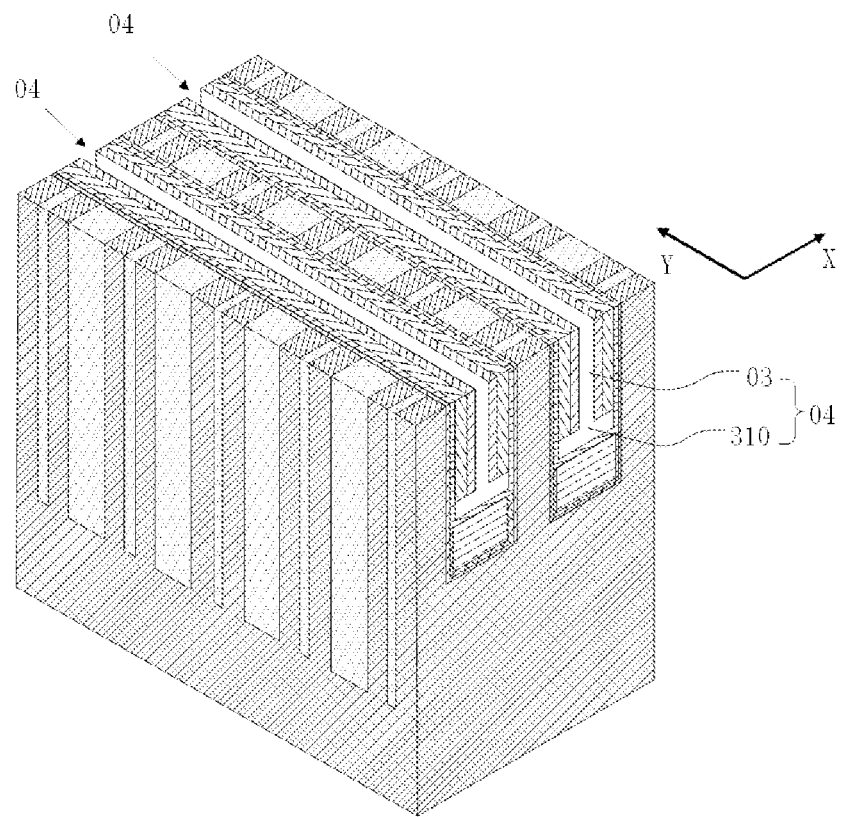
FIG. 33 is a schematic diagram of forming a fourth trench in a method of manufacturing a semiconductor structure according to an exemplary embodiment.
Figure 36:
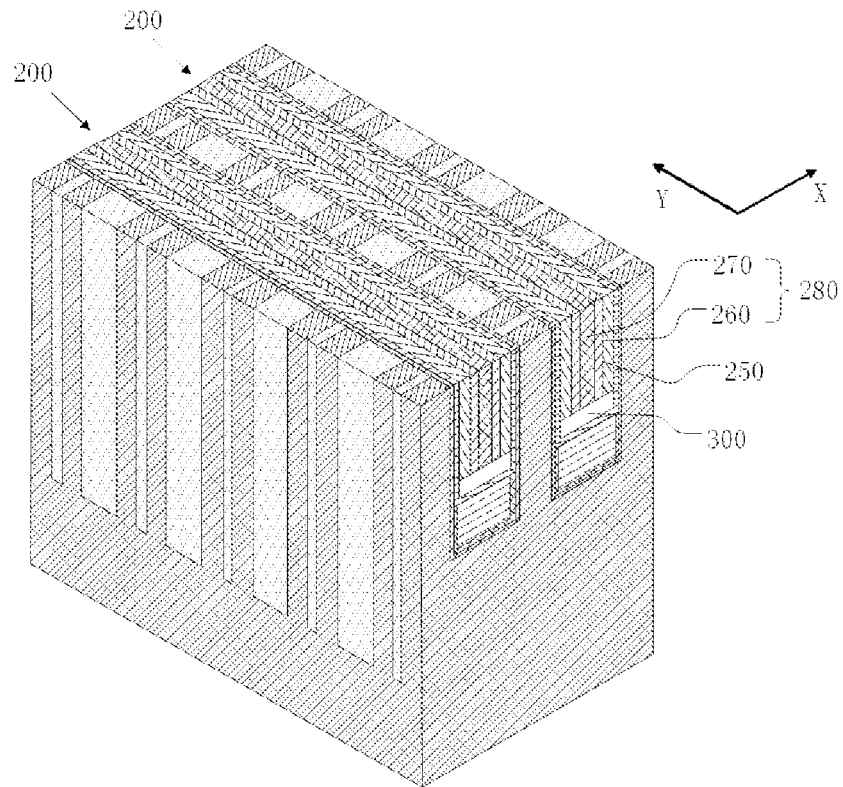
FIG. 36 is a schematic diagram of forming a word line structure in a method of manufacturing a semiconductor structure according to an exemplary embodiment.

As shown in FIG. 33, the horizontal portion 251 of the sacrificial structure 250 may be removed through an etching process, or the horizontal portion 251 of the sacrificial structure 250 may be removed through plasma reaction release. As shown in FIG. 36, the first trench 01 may be closed by disposition through a chemical vapor deposition (CVD) process or a physical vapor deposition (PVD) process, such that an air chamber 300 is formed at an original position of the horizontal portion 251 of the sacrificial structure 250.

According to the method of manufacturing a semiconductor structure provided in this embodiment, an air chamber is formed above a conductive layer, and the existence of the air chamber reduces a parasitic capacitance between conducting wires of the semiconductor structure, reduces the intensity of interference between the conducting wires caused by the parasitic capacitance, and improves electrical performance of the semiconductor structure.

Figure 2:
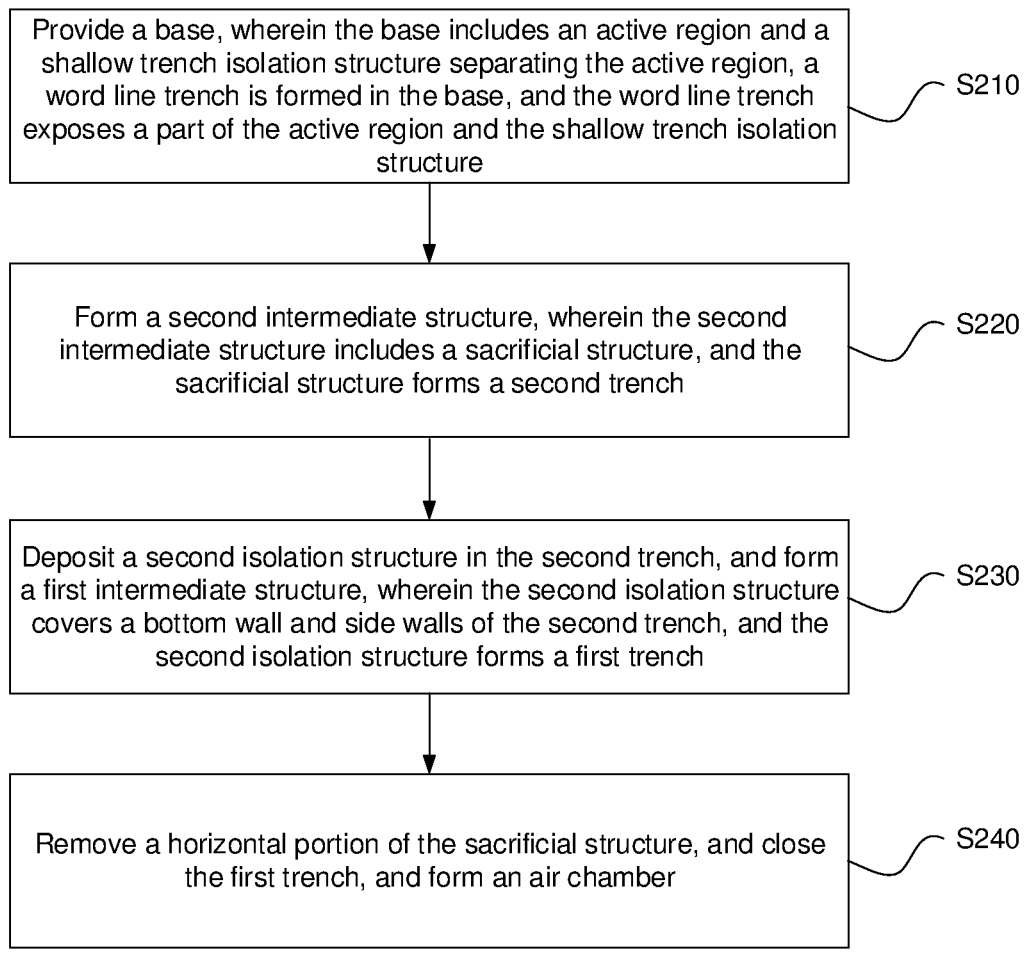
FIG. 2 is a flowchart of a method of manufacturing a semiconductor structure according to an exemplary embodiment.

An exemplary embodiment of the present disclosure provides a method of manufacturing a semiconductor structure, as shown in FIG. 2. FIG. 2 is a flowchart of a method of manufacturing a semiconductor structure according to an exemplary embodiment of the present disclosure.

As shown in FIG. 2, the method of manufacturing a semiconductor structure according to the exemplary embodiment of the present disclosure includes the following steps:

Step S210: Provide a base, wherein the base includes an active region and a shallow trench isolation structure separating the active region, a word line trench is formed in the base, and the word line trench exposes a part of the active region and the shallow trench isolation structure.

In this embodiment, step S210 of this embodiment is implemented in the same manner as step S110 of the foregoing embodiment, and will not be described in detail again herein.

Step S220: Form a second intermediate structure, wherein the second intermediate structure includes a sacrificial structure, and the sacrificial structure forms a second trench.

Figure 24:
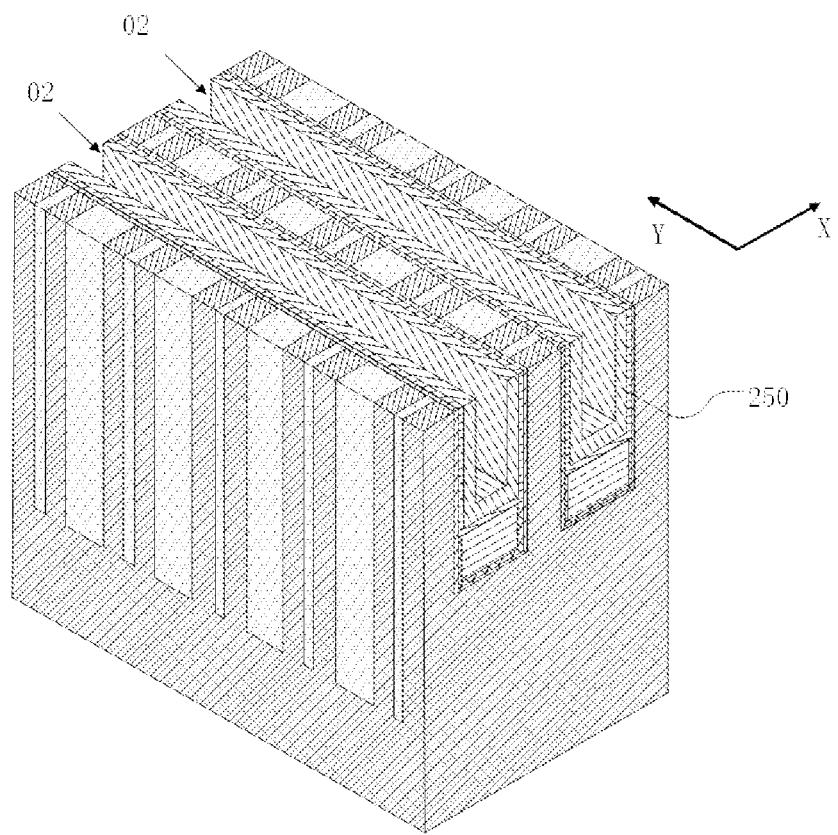
FIG. 24 is a schematic diagram of forming a sacrificial structure in a method of manufacturing a semiconductor structure according to an exemplary embodiment.
Figure 25:
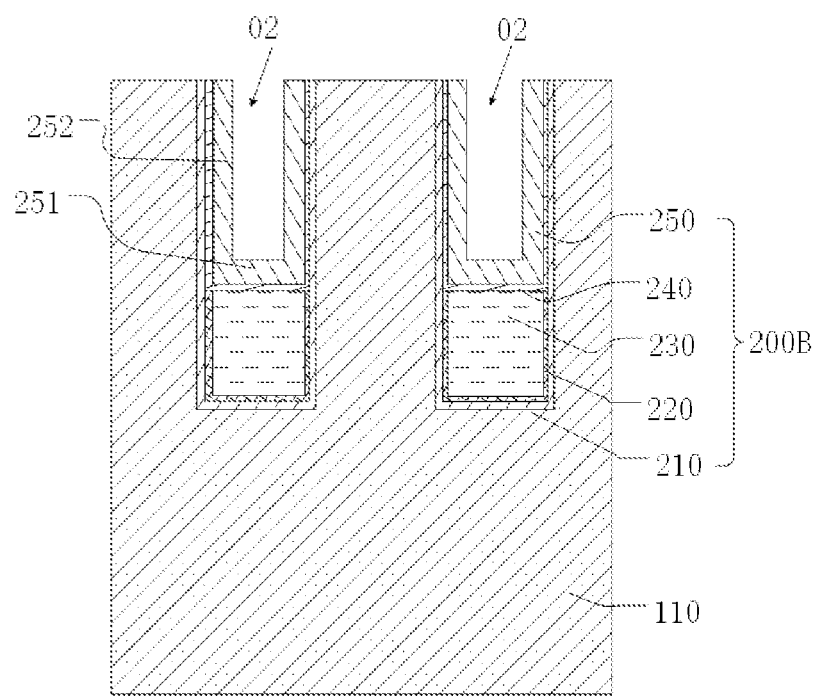
FIG. 25 is a schematic cross-sectional view of FIG. 24 along a direction x.
Figure 26:
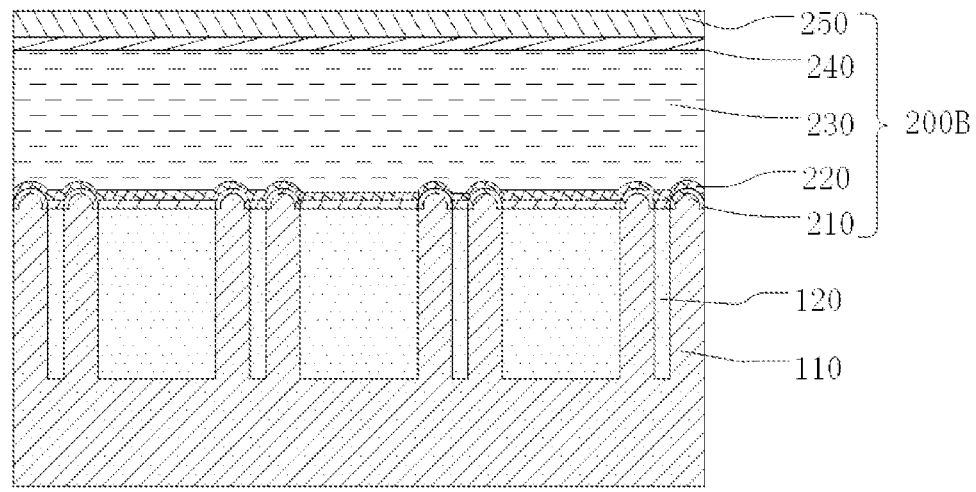
FIG. 26 is a schematic cross-sectional view of a second trench in FIG. 24 along a direction y.

As shown in FIG. 24, a second intermediate structure 200B is an intermediate process structure formed during the formation of the word line structure 200. As shown in FIG. 25 and FIG. 26, the second intermediate structure 200B is a laminated structure, and the second intermediate structure 200B includes a sacrificial structure 250. The sacrificial structure 250 includes a horizontal portion 251 and a vertical portion 252. The second intermediate structure 200B is located in the word line trench 130, and encloses a second trench 02 in the word line trench 130. The horizontal portion 251 of the sacrificial structure 250 serves as a bottom surface of the second trench 02, and the vertical portion 252 of the sacrificial structure 250 serves as a trench wall of the second trench 02.

Step S230: Deposit a second isolation structure in the second trench, and form a first intermediate structure, wherein the second isolation structure covers a bottom wall and side walls of the second trench, and the second isolation structure forms a first trench.

Figure 27:
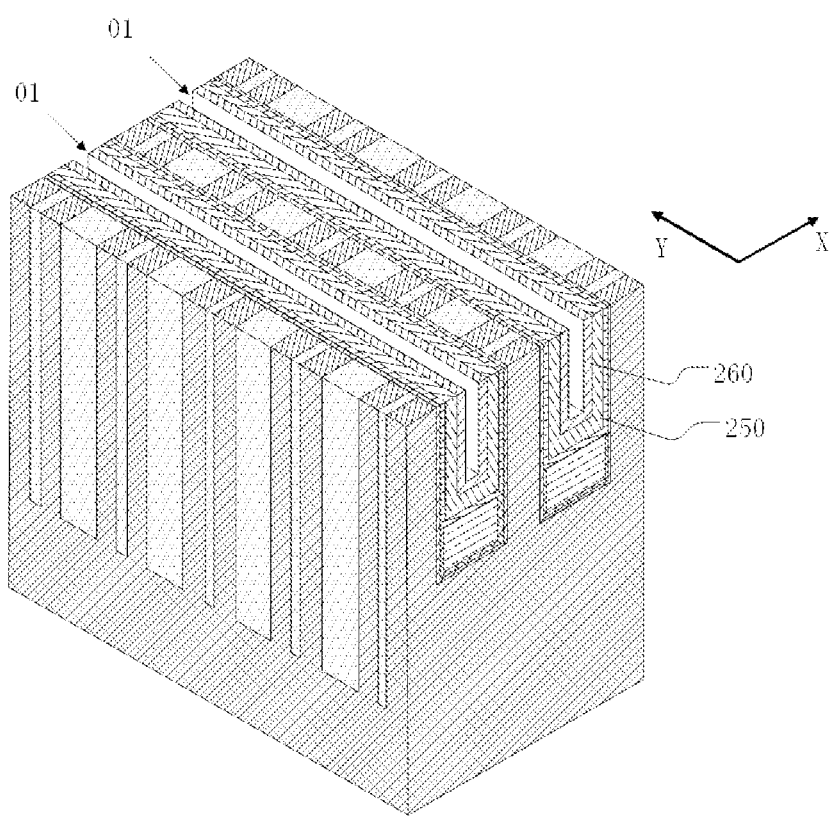
FIG. 27 is a schematic diagram of forming a second isolation structure in a method of manufacturing a semiconductor structure according to an exemplary embodiment.

As shown in FIG. 27, referring to FIG. 24, in this embodiment, the second isolation structure 260 and the second intermediate structure 200B form the first intermediate structure 200A, and the first intermediate structure 200A is an intermediate process structure formed during the formation of the word line structure 200. As shown in FIG. 28 and FIG. 29, referring to FIG. 25 and FIG. 26, the second isolation structure 260 may be deposited through an ALD process. The second isolation structure 260 covers an inner wall of the second trench 02. The first trench 01 is formed in the second trench 02. A width of the first trench 01 is smaller than a width of the horizontal portion 251 of the sacrificial structure 250. A material of the second isolation structure 260 is different from a material of the sacrificial structure 250. In this embodiment, the material of the second isolation structure 260 may be silicon nitride or silicon oxynitride. In this embodiment, the material of the second isolation structure 260 is silicon nitride, and a thickness of the second isolation structure 260 ranges from 2 nm to 4 nm.

Step S240: Remove the horizontal portion of the sacrificial structure, and close the first trench, and form an air chamber.

Figure 34:
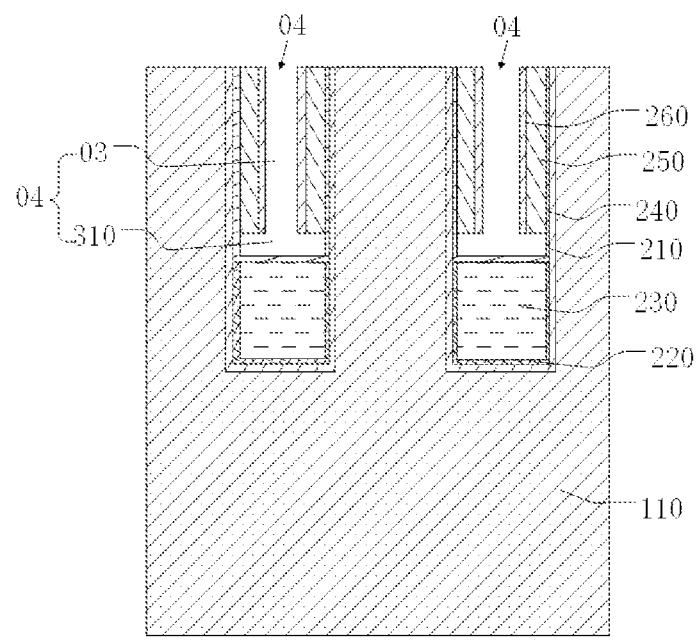
FIG. 34 is a schematic cross-sectional view of FIG. 33 along a direction x.
Figure 35:
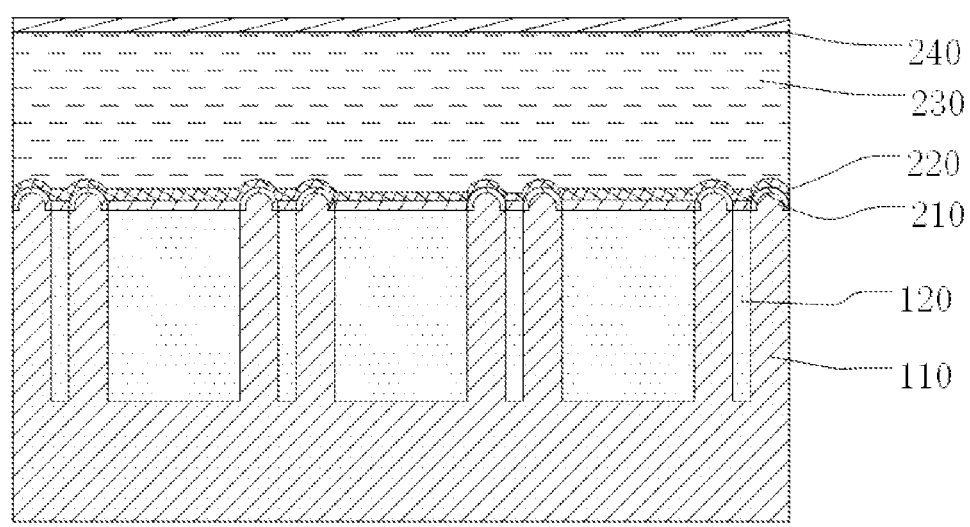
FIG. 35 is a schematic cross-sectional view of the fourth trench in FIG. 33 along a direction y.
Figure 39:
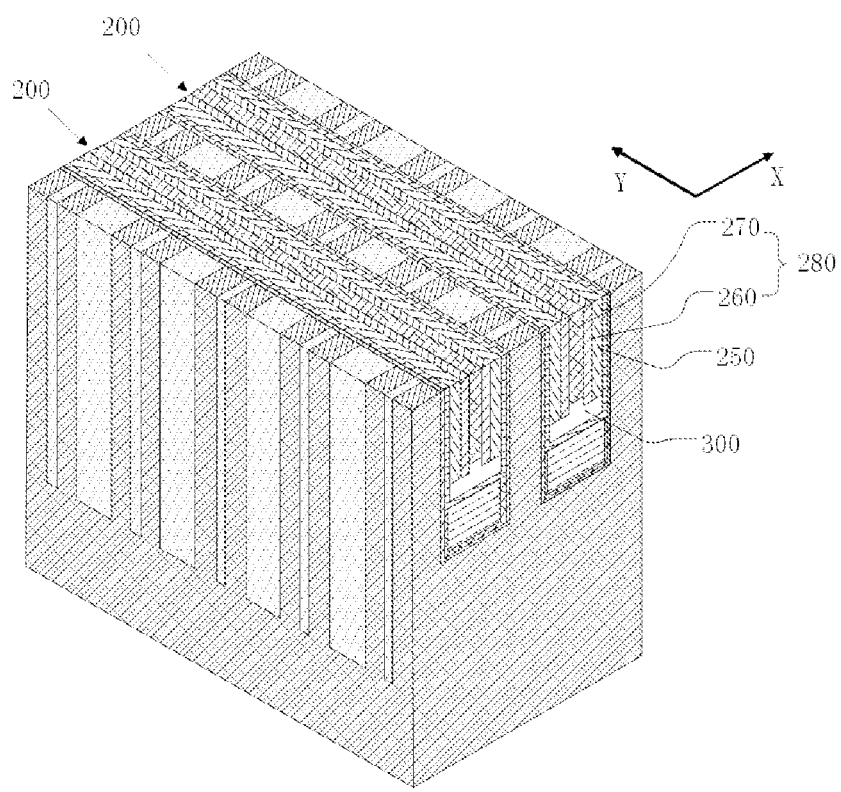
FIG. 39 is a schematic diagram of forming a word line structure in a method of manufacturing a semiconductor structure according to an exemplary embodiment.

As shown in FIG. 33, with reference to FIG. 34 and FIG. 35, the horizontal portion 251 of the sacrificial structure 250 may be removed through etching, such that after the first trench 01 is closed, as shown in FIG. 36 or FIG. 39, the air chamber 300 is formed at an original position of the horizontal portion 251 of the sacrificial structure 250.

The semiconductor structure formed in this embodiment undergoes a subsequent manufacturing process to form a bit line structure, a capacitor contact structure, or other conducting wire structures, and an air chamber is located between a conductive layer of a word line structure and the conducting wire structure formed in the subsequent manufacturing process, such that a parasitic capacitance between the word line structure and the conducting wire structure formed in the subsequent manufacturing process can be reduced, thereby preventing the parasitic capacitance from causing mutual interference between conducting wires, and improving electrical performance and stability of the semiconductor structure.

Figure 3:
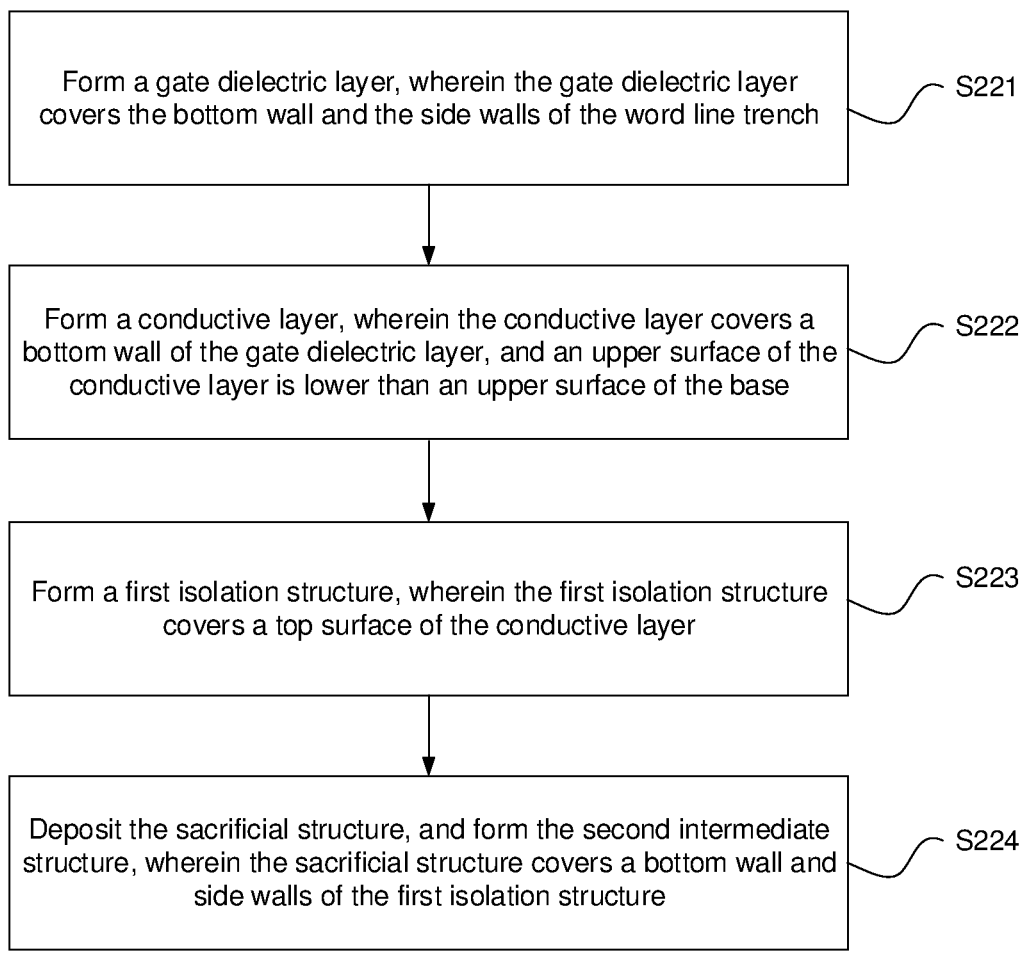
FIG. 3 is a flowchart of forming a second intermediate structure in a method of manufacturing a semiconductor structure according to an exemplary embodiment.

For example, a process of implementing step S220 in this embodiment is described. As shown in FIG. 3, the forming a second intermediate structure includes the following steps:

Step S221: Form a gate dielectric layer, wherein the gate dielectric layer covers the bottom wall and the side walls of the word line trench.

Figure 9:
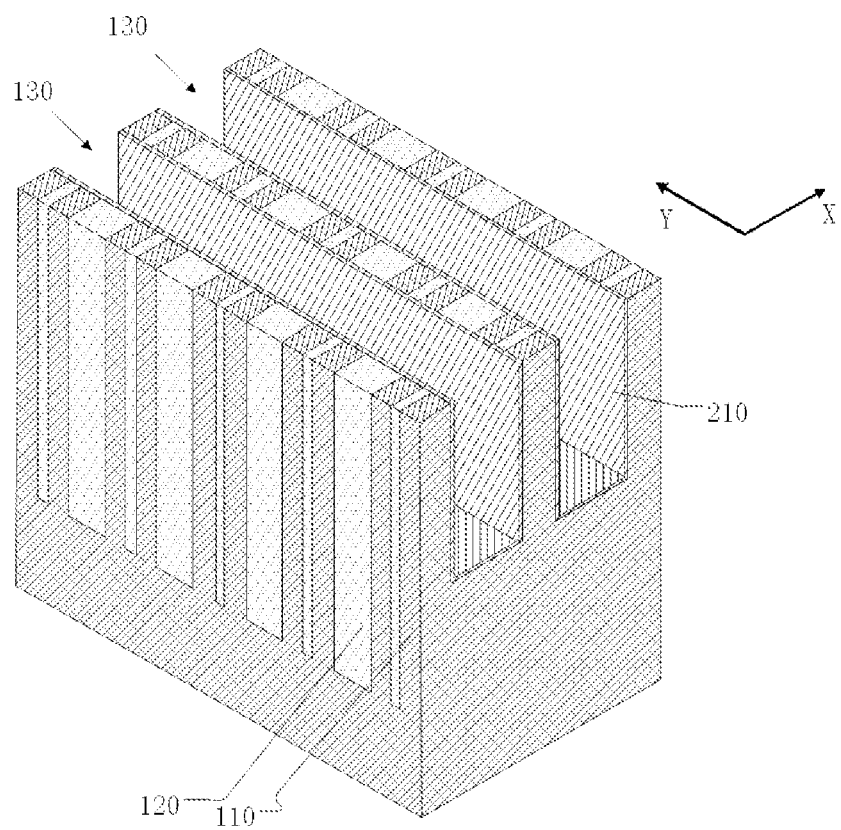
FIG. 9 is a schematic diagram of forming a gate dielectric layer in a method of manufacturing a semiconductor structure according to an exemplary embodiment.
Figure 10:
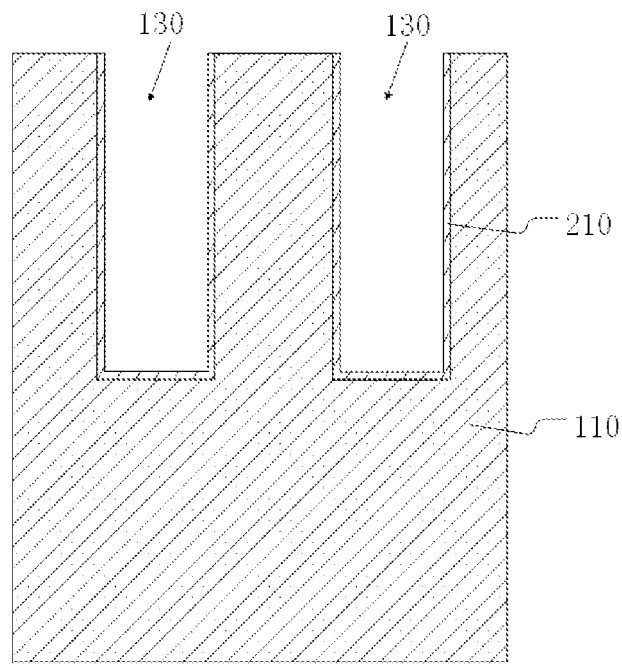
FIG. 10 is a schematic cross-sectional view of FIG. 9 along a direction x.
Figure 11:
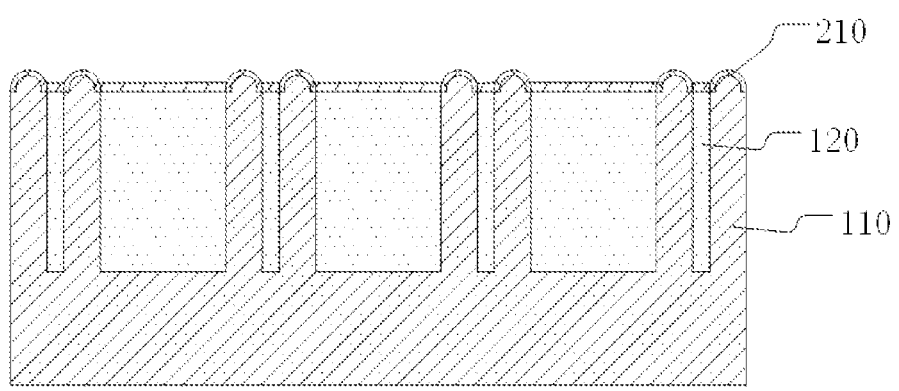
FIG. 11 is a schematic cross-sectional view of word line trenches in FIG. 9 along a direction y.

As shown in FIG. 9, FIG. 10, and FIG. 11, referring to FIG. 6, FIG. 7, and FIG. 8, the gate dielectric layer 210 may be deposited through an ALD process. A material of the gate dielectric layer 210 may be silicon oxide, hafnium oxide, lanthanum oxide, or the like.

Step S222: Form a conductive layer, wherein the conductive layer covers a bottom wall of the gate dielectric layer, and an upper surface of the conductive layer is lower than an upper surface of the base.

Figure 15:
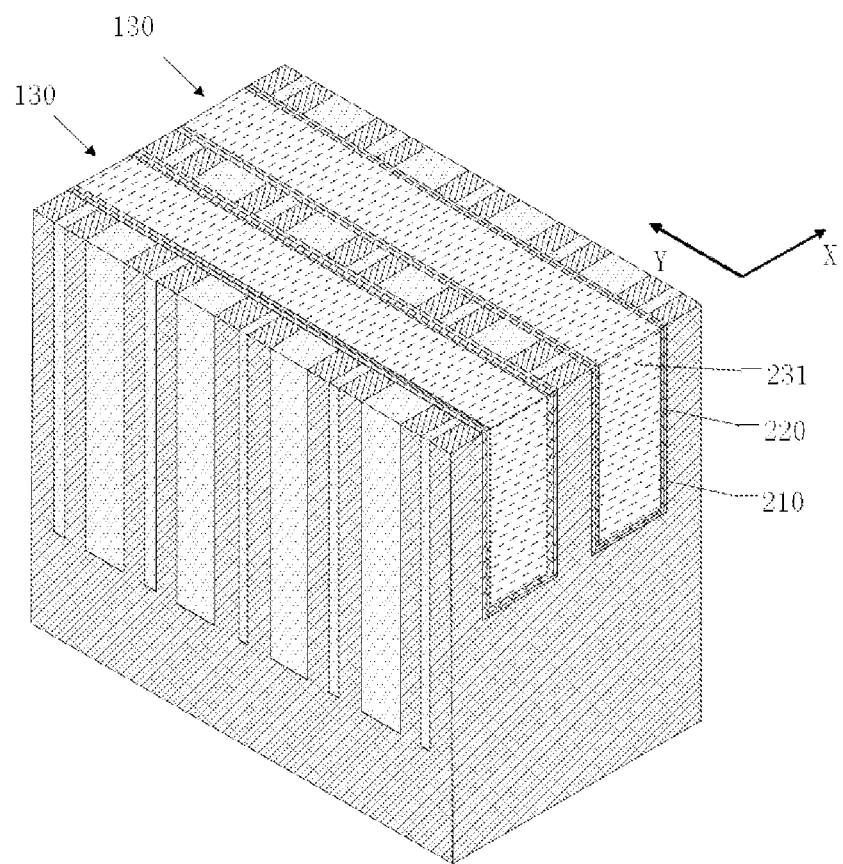
FIG. 15 is a schematic diagram of forming an initial conductive layer in a method of manufacturing a semiconductor structure according to an exemplary embodiment.
Figure 16:
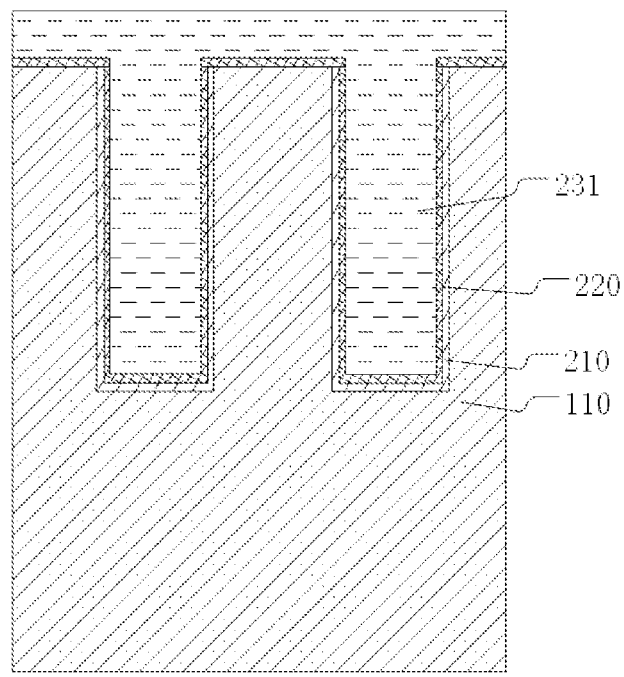
FIG. 16 is a schematic cross-sectional view of FIG. 15 along a direction x.
Figure 17:
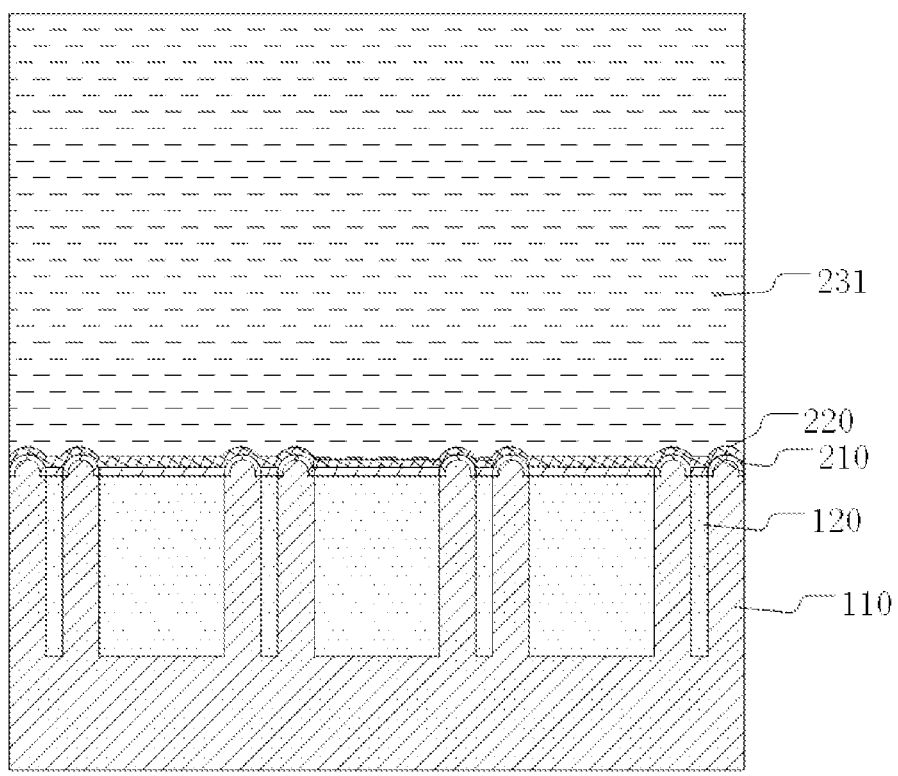
FIG. 17 is a schematic cross-sectional view of word line trenches in FIG. 15 along a direction y.
Figure 18:
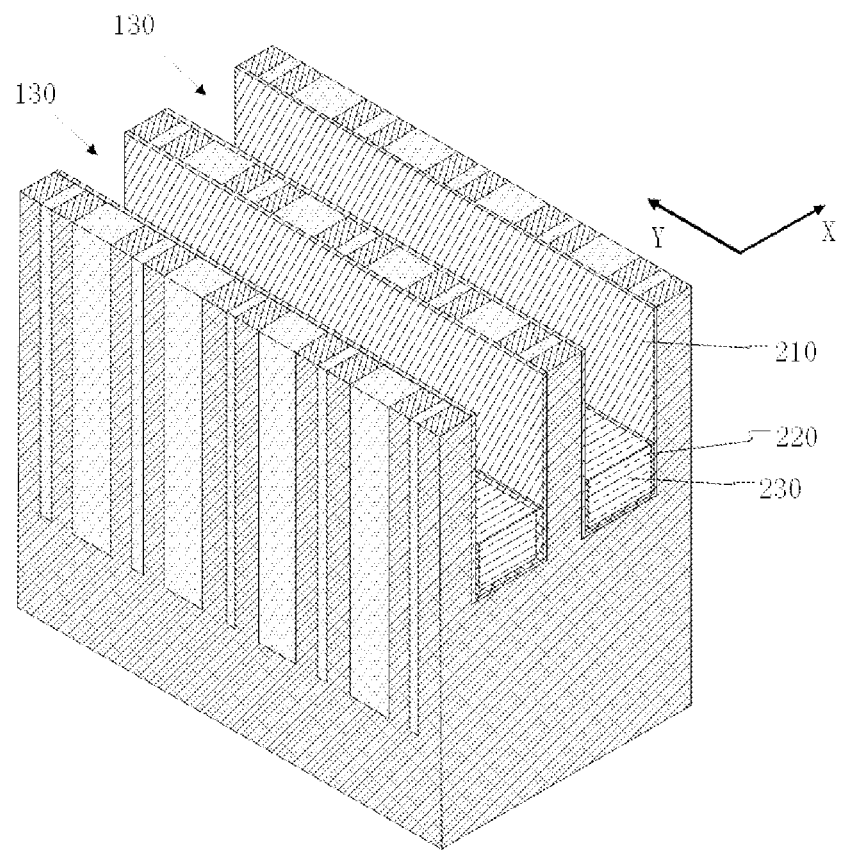
FIG. 18 is a schematic diagram of forming a conductive layer in a method of manufacturing a semiconductor structure according to an exemplary embodiment.
Figure 19:
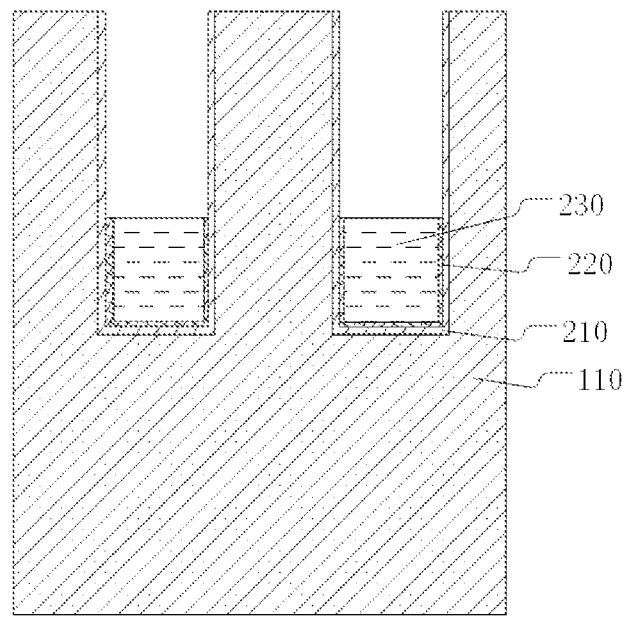
FIG. 19 is a schematic cross-sectional view of FIG. 18 along a direction x.
Figure 20:
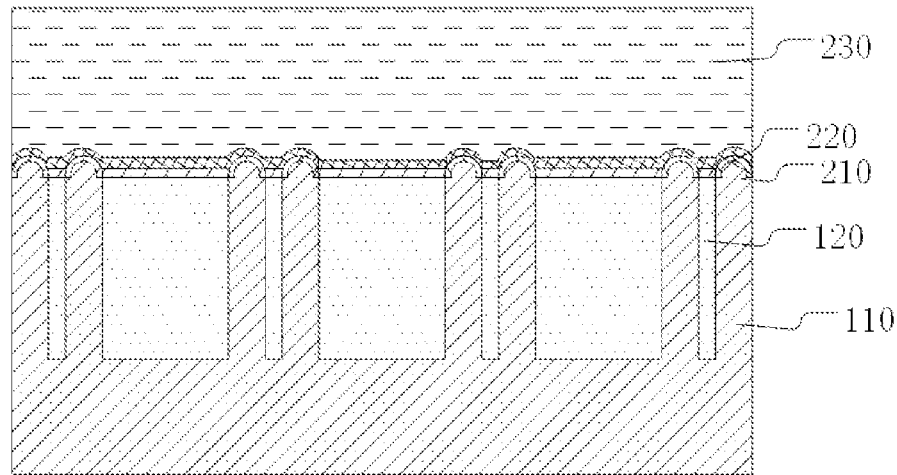
FIG. 20 is a schematic cross-sectional view of word line trenches in FIG. 18 along a direction y.

In this embodiment, the process of forming the conductive layer 230 includes the following steps: As shown in FIG. 15, FIG. 16, and FIG. 17, a conductive material is deposited through an ALD process to fill the word line trench 130 and cover the gate dielectric layer 210 to form an initial conductive layer 231. Then, as shown in FIG. 18, FIG. 19, and FIG. 20, the initial conductive layer 231 is etched through a dry or wet etching process, the initial conductive layer 231 covering the gate dielectric layer 210 is removed and the initial conductive layer 231 is etched back to a position lower than the top surface of the base 100, the retained part of the initial conductive layer 231 forms the conductive layer 230, and an upper part of the conductive layer 230 is retained for forming a space of the air chamber 300. The conductive layer 230 is located at the bottom of the word line trench 130 and covers a bottom wall of the gate dielectric layer 210. The conductive layer 230 exposes a part of side walls of the gate dielectric layer 210.

A material of the conductive layer 230 may be one or two or more of a conductive metal, conductive metal nitride, and conductive alloy. For example, the material of the conductive layer 230 may be titanium, tantalum, or tungsten. In this embodiment, the material of the conductive layer 230 is metal tungsten.

Step S223: Form a first isolation structure, wherein the first isolation structure covers a top surface of the conductive layer.

Figure 21:
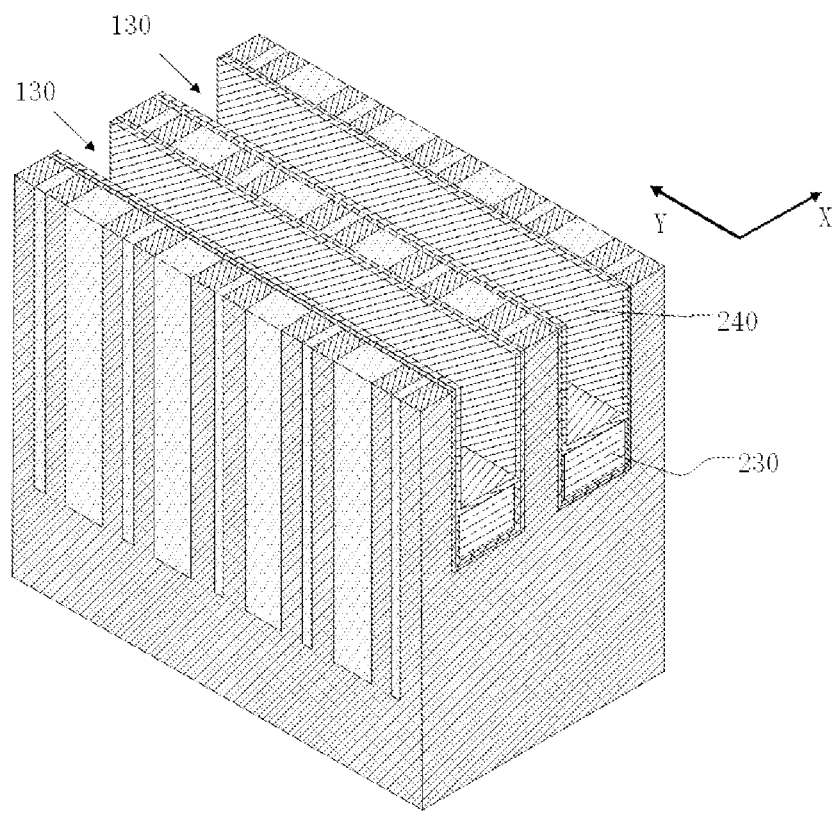
FIG. 21 is a schematic diagram of forming a first isolation structure in a method of manufacturing a semiconductor structure according to an exemplary embodiment.
Figure 22:
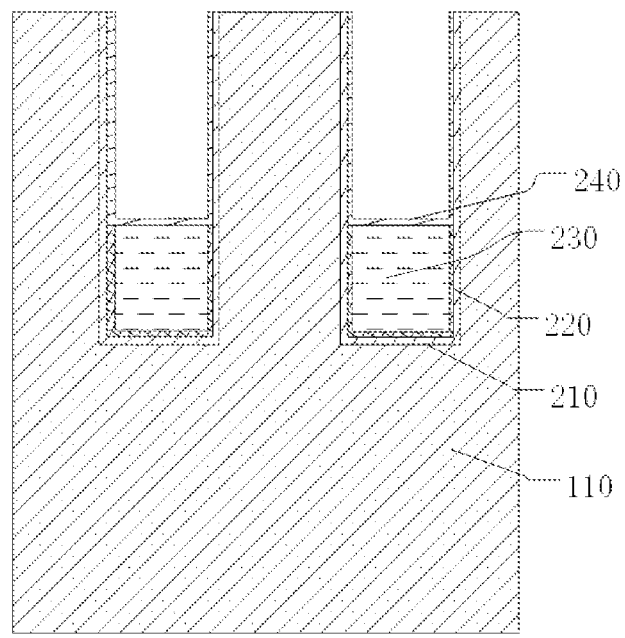
FIG. 22 is a schematic cross-sectional view of FIG. 21 along a direction x.
Figure 23:
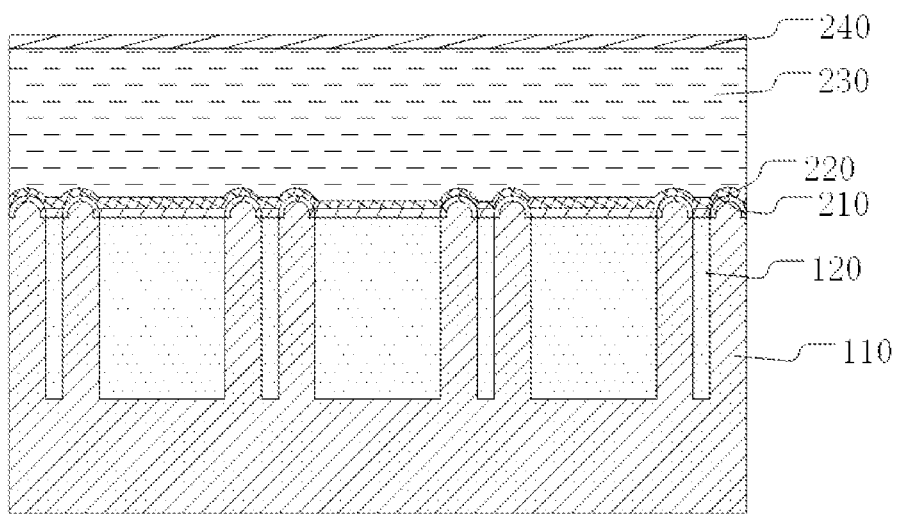
FIG. 23 is a schematic cross-sectional view of word line trenches in FIG. 21 along a direction y.

As shown in FIG. 21, FIG. 22, and FIG. 23, referring to FIG. 18, FIG. 19, and FIG. 20, a first isolation structure 240 may be deposited through an ALD process.

For example, a material of the first isolation structure 240 may be silicon nitride or silicon oxynitride. In this embodiment, the material of the first isolation structure 240 is silicon nitride, and a thickness of the first isolation structure 240 ranges from 2 nm to 4 nm.

Step S224: Deposit the sacrificial structure, and form the second intermediate structure, wherein the sacrificial structure covers a bottom wall and side walls of the first isolation structure.

As shown in FIG. 24, referring to FIG. 21, a sacrificial material may be deposited through an ALD process, wherein the sacrificial material covers the bottom wall and the side walls of the first isolation structure 240 to form the sacrificial structure 250. As shown in FIG. 25 and FIG. 26, a part of the sacrificial structure 250 covering the bottom wall of the first isolation structure 240 is the horizontal portion 251 of the sacrificial structure 250, and a part of the sacrificial structure 250 covering the side walls of the first isolation structure 240 is the vertical portion 252 of the sacrificial structure 250. In order to remove the horizontal portion 251 of the sacrificial structure 250 without damaging the bottom wall of the first isolation structure 240, the bottom wall of the first isolation structure 240 is retained to protect the conductive layer 230. In this embodiment, a material of the sacrificial structure 250 is different from a material of the first isolation structure 240, such that during removal of the horizontal portion 251 of the sacrificial structure 250 through etching, the horizontal portion 251 of the sacrificial structure 250 can be removed without damaging the first isolation structure 240 by selecting an etch selectivity for etching the sacrificial structure 250 and the first isolation structure 240. In this embodiment, the material of the sacrificial structure 250 may be silicon oxide (Silicon monoxide).

A thickness of the sacrificial structure 250 affects a volume of the air chamber 300 formed in the semiconductor structure. In order to form the air chamber 300 and ensure the volume of the air chamber 300, in this embodiment, the thickness of the sacrificial structure 250 ranges from 4 nm to 6 nm.

Figure 12:
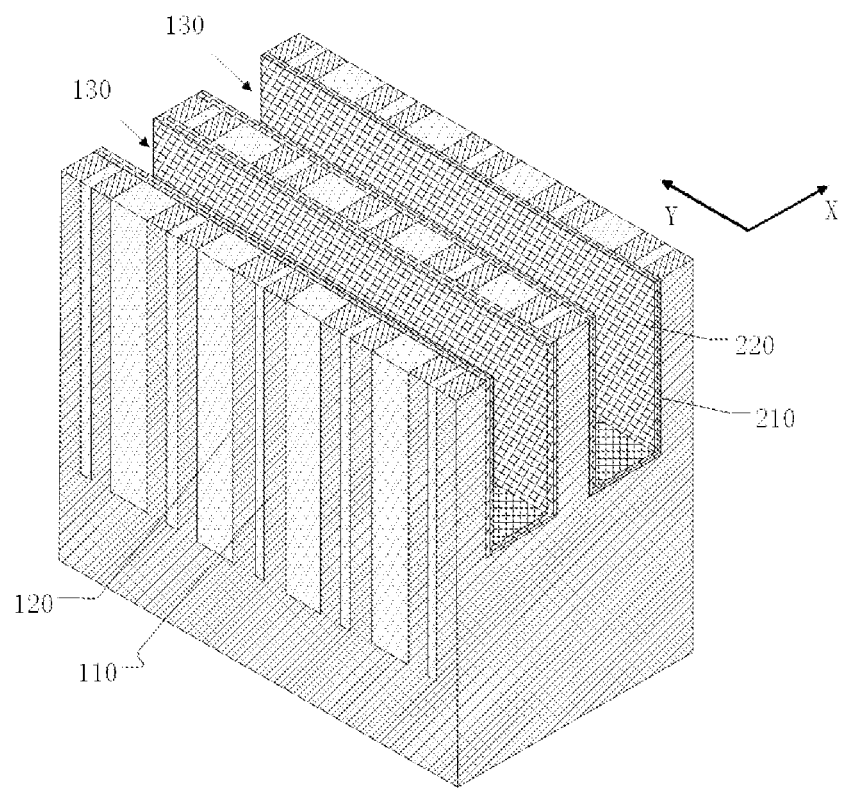
FIG. 12 is a schematic diagram of forming a barrier layer in a method of manufacturing a semiconductor structure according to an exemplary embodiment.
Figure 13:
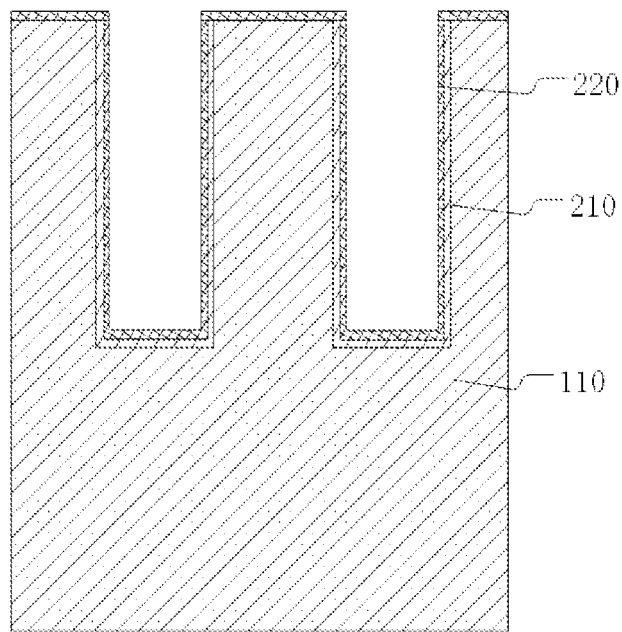
FIG. 13 is a schematic cross-sectional view of FIG. 12 along a direction x.
Figure 14:
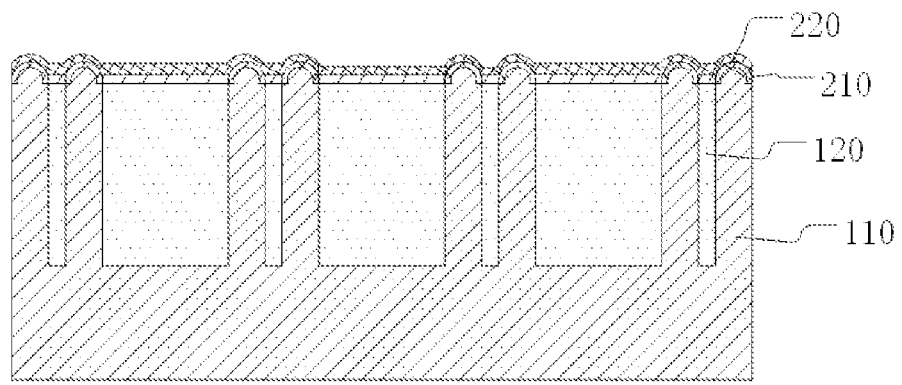
FIG. 14 is a schematic cross-sectional view of word line trenches in FIG. 12 along a direction y.

In this embodiment, after the formation of the gate dielectric layer 210 and before the formation of the conductive layer 230, as shown in FIG. 12, a step of forming a barrier layer 220 through an ALD process is further included. As shown in FIG. 13 and FIG. 14, the formed barrier layer 220 covers the gate dielectric layer 210. In this embodiment, for example, a material of the barrier layer 220 may be titanium nitride.

After the completion of step S222 described above, as shown in FIG. 18 and FIG. 19, referring to FIG. 15 and FIG. 16, the conductive layer 230 is located at the bottom of the word line trench 130 and covers the bottom wall of the gate dielectric layer 210, and the conductive layer 230 exposes a part of the side walls of the gate dielectric layer 210. The retained initial conductive layer 231 forms the conductive layer 230. The barrier layer 220 is located between the conductive layer 230 and the gate dielectric layer 210, to prevent the material of the conductive layer 230 from penetrating the base 100 to affect a yield of the semiconductor structure.

The second intermediate structure formed in this embodiment includes a conductive layer and a sacrificial structure located above the conductive layer, and a horizontal portion of the sacrificial structure and the conductive layer are separated by a first isolation structure. An air chamber with a low dielectric constant is formed above the conductive layer of a word line structure by removing the horizontal portion of the sacrificial structure. The air chamber can change electrical performance of an isolation structure located above the conductive layer, and reduce a parasitic capacitance between conducting wires in the semiconductor structure.

Figure 4:
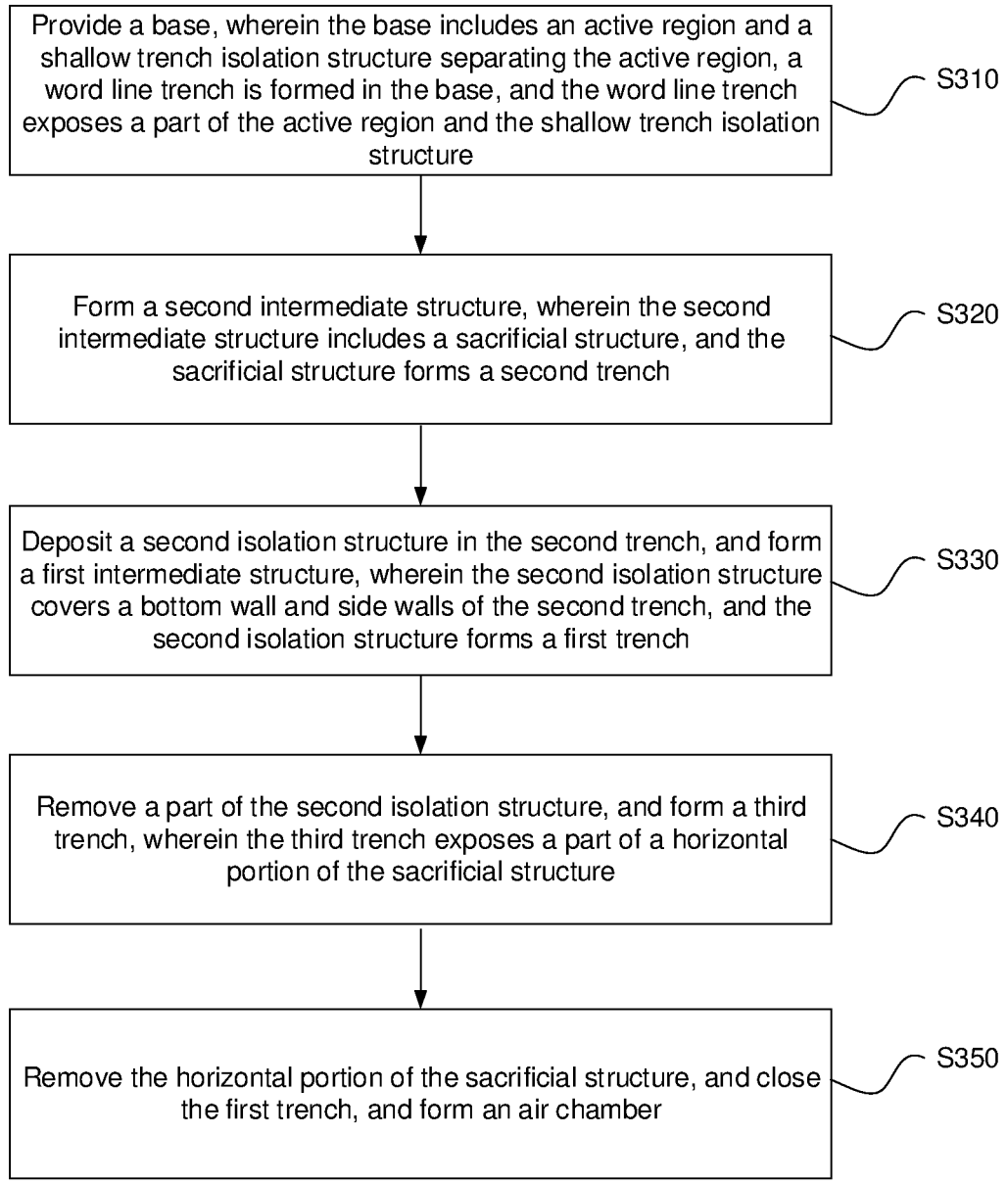
FIG. 4 is a flowchart of a method of manufacturing a semiconductor structure according to an exemplary embodiment.

An exemplary embodiment of the present disclosure provides a method of manufacturing a semiconductor structure, as shown in FIG. 4. FIG. 4 is a flowchart of a method of manufacturing a semiconductor structure according to an exemplary embodiment of the present disclosure.

As shown in FIG. 4, the method of manufacturing a semiconductor structure according to the exemplary embodiment of the present disclosure includes the following steps:

Step S310: Provide a base, wherein the base includes an active region and a shallow trench isolation structure separating the active region, a word line trench is formed in the base, and the word line trench exposes a part of the active region and the shallow trench isolation structure.

Step S310 of this embodiment is implemented in the same manner as step S110 of the foregoing embodiment, and will not be described in detail again herein.

Step S320: Form a second intermediate structure, wherein the second intermediate structure includes a sacrificial structure, and the sacrificial structure forms a second trench.

As shown in FIG. 24, the second intermediate structure 200B is an intermediate process structure formed during the formation of a word line structure 200. This is shown in FIG. 25 and FIG. 26. The second intermediate structure 200B is a laminated structure. The second intermediate structure 200B includes a gate dielectric layer 210 covering a word line trench 130, a conductive layer 230 covering a bottom wall of the gate dielectric layer 210 and having a top surface lower than a top surface of a base 100, a barrier layer 220 provided between the conductive layer 230 and the gate dielectric layer 210, a first isolation structure 240 of the gate dielectric layer 210 that covers a top surface of the conductive layer 230 and that is exposed by the conductive layer 230, and a sacrificial structure 250 covering the first isolation structure 240.

As shown in FIG. 25, the sacrificial structure 250 includes a horizontal portion 251 and a vertical portion 252, and the sacrificial structure 250 encloses a second trench 02 in the word line trench 130. The horizontal portion 251 of the sacrificial structure 250 serves as a bottom surface of the second trench 02, and the vertical portion 252 of the sacrificial structure 250 serves as a trench wall of the second trench 02.

Step S330: Deposit a second isolation structure in the second trench, and form a first intermediate structure, wherein the second isolation structure covers a bottom wall and side walls of the second trench, and the second isolation structure forms a first trench.

As shown in FIG. 27, referring to FIG. 24, a second isolation structure 260 is formed in the second intermediate structure 200B. As shown in FIG. 29, referring to FIG. 26, the second isolation structure 260 covers the sacrificial structure 250, and the second isolation structure 260 and the second intermediate structure 200B form a first intermediate structure 200A. As shown in FIG. 28, referring to FIG. 25, a first trench 01 formed by the second isolation structure is narrower than the second trench 02 formed by the sacrificial structure 250.

Step S340: Remove a part of the second isolation structure, and form a third trench, wherein the third trench exposes a part of a horizontal portion of the sacrificial structure.

Figure 31:
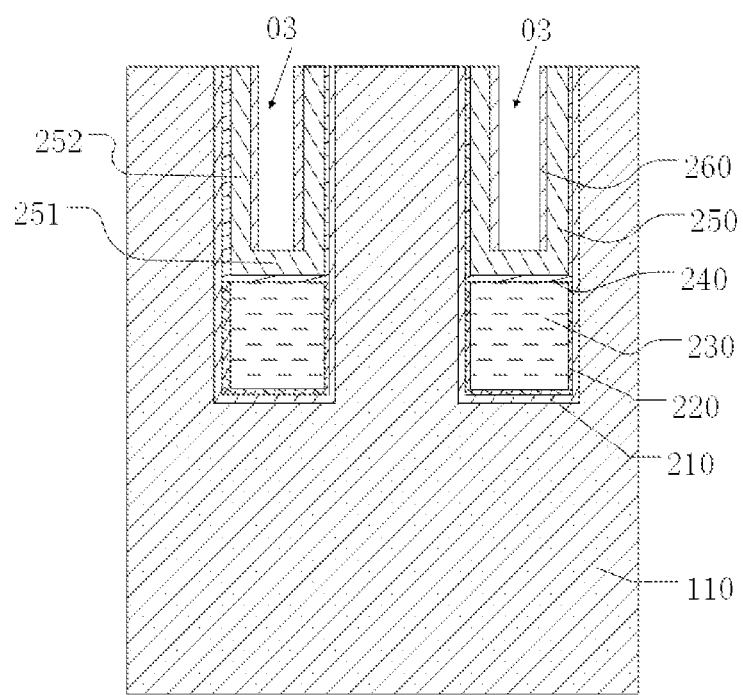
FIG. 31 is a schematic cross-sectional view of FIG. 30 along a direction x.
Figure 32:
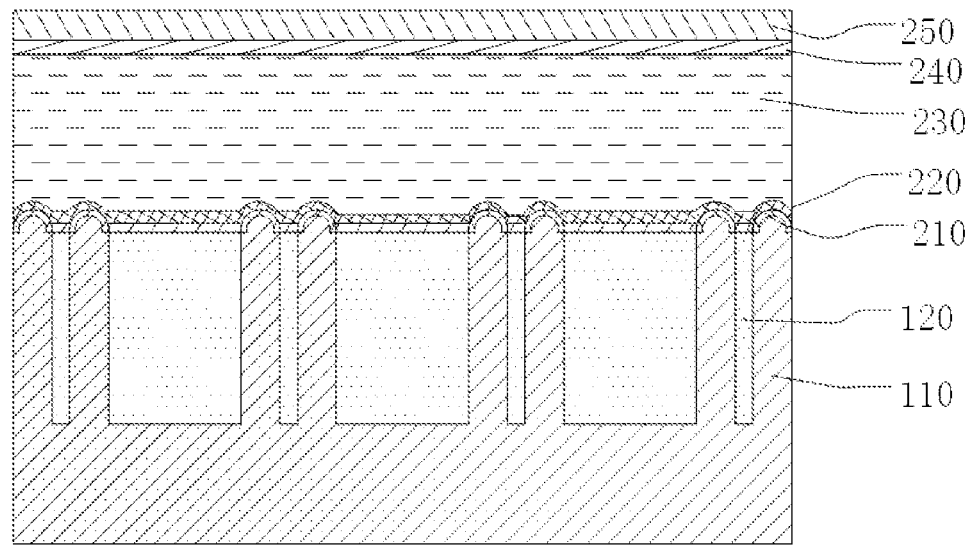
FIG. 32 is a schematic cross-sectional view of a third trench in FIG. 30 along a direction y.

As shown in FIG. 30, FIG. 31, and FIG. 32, referring to FIG. 27, FIG. 28, and FIG. 29, a part of a bottom wall of the second isolation structure 260 may be removed by etching through a dry or wet etching process, to expose a part of the horizontal portion 251 of the sacrificial structure 250, to form a third trench 03. A width of the third trench 03 is smaller than a width of the horizontal portion 251 of the sacrificial structure 250.

Step S350: Remove the horizontal portion of the sacrificial structure, and close the first trench, and form an air chamber.

As shown in FIG. 33, referring to FIG. 30, with reference to FIG. 34 and FIG. 35, the horizontal portion 251 of the sacrificial structure 250 is removed, and a trench communicating with the third trench 03 is formed at an original position of the horizontal portion 251 of the sacrificial structure 250.

As shown in FIG. 36 or FIG. 39, referring to FIG. 33, a filling material is deposited through a CVD process or a PVD process to close the trench, and the deposition process is affected by a shape of an inner wall of the trench, such that the bottom of an original position of the first trench 01 is first closed by the filling material, and a region in the trench not filled by the filling material forms an air chamber 300.

In this embodiment, a sacrificial structure and a second isolation structure are formed, and then a horizontal portion of the sacrificial structure and a part of the second isolation structure are removed, such that a trench communicating with a third trench is formed at an original position of the horizontal portion of the sacrificial structure, and a deposition process of filling the trench is affected by a shape of an inner wall of the trench, thereby forming a deposition blank above a conductive layer to form an air chamber. As the air chamber has a low dielectric constant, the existence of the air chamber can reduce a parasitic capacitance between a word line structure and other conducting wires of the semiconductor structure, thereby improving electrical performance and stability of the semiconductor structure.

Figure 5:
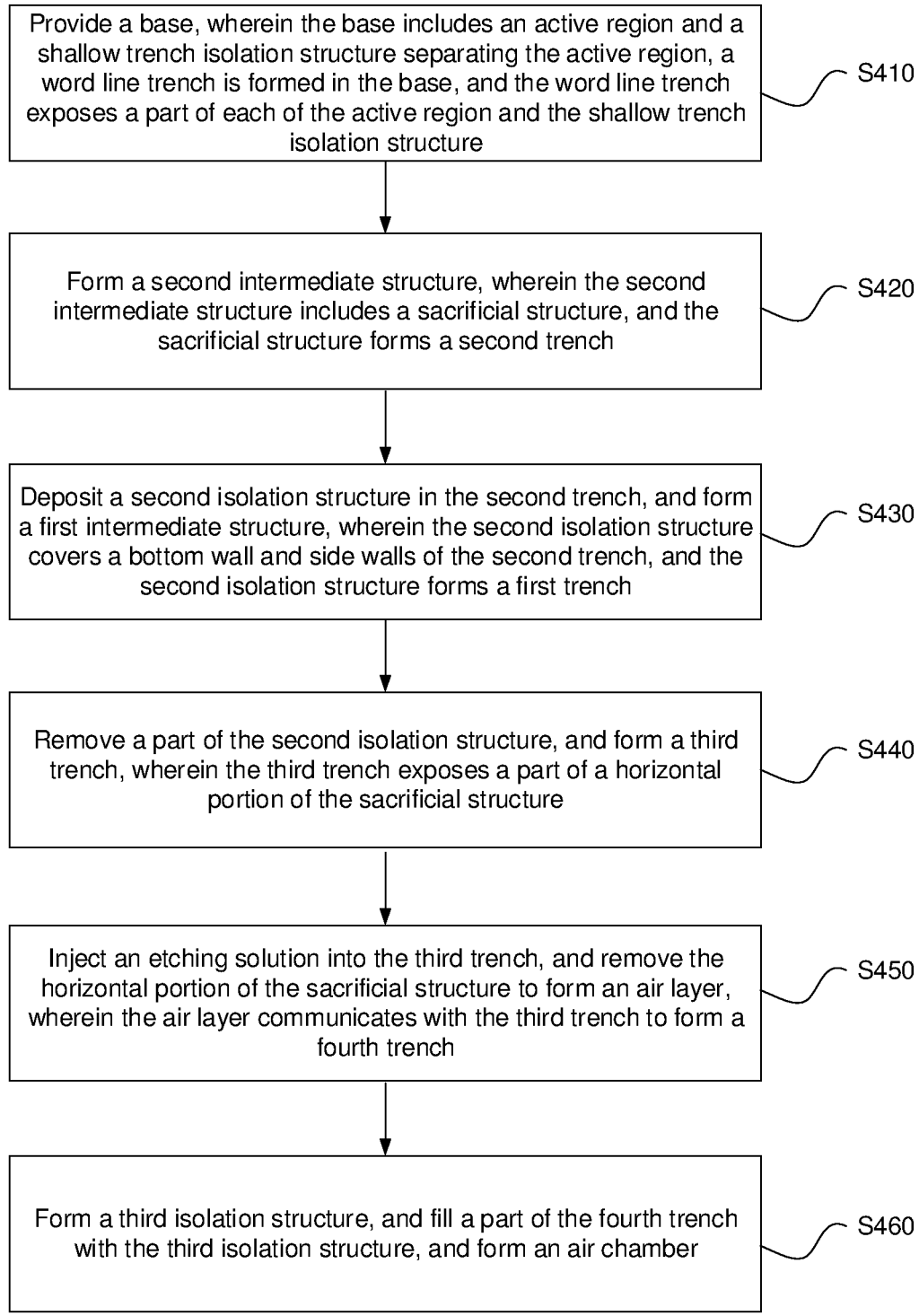
FIG. 5 is a flowchart of a method of manufacturing a semiconductor structure according to an exemplary embodiment.

An exemplary embodiment of the present disclosure provides a method of manufacturing a semiconductor structure, as shown in FIG. 5. FIG. 5 is a flowchart of a method of manufacturing a semiconductor structure according to an exemplary embodiment of the present disclosure.

As shown in FIG. 5, the method of manufacturing a semiconductor structure according to the exemplary embodiment of the present disclosure includes the following steps:

Step S410: Provide a base, wherein the base includes an active region and a shallow trench isolation structure separating the active region, a word line trench is formed in the base, and the word line trench exposes a part of the active region and the shallow trench isolation structure.

Step S420: Form a second intermediate structure, wherein the second intermediate structure includes a sacrificial structure, and the sacrificial structure forms a second trench.

Step S430: Deposit a second isolation structure in the second trench, and form a first intermediate structure, wherein the second isolation structure covers a bottom wall and side walls of the second trench, and the second isolation structure forms a first trench.

Steps S410 to S430 of this embodiment are implemented in the same manner as steps S310 to S330 of the foregoing embodiment, and will not be described in detail again herein.

Step S440: Remove a part of the second isolation structure, and form a third trench, wherein the third trench exposes a part of a horizontal portion of the sacrificial structure.

As shown in FIG. 30, FIG. 31, and FIG. 32, referring to FIG. 27, FIG. 28, and FIG. 29, a second isolation structure 260 covering the horizontal portion 251 of the sacrificial structure 250 is removed, and form a third trench 03. An etching gas is injected into the first trench 01. With a top surface of a base 100 as a horizontal direction and an extension direction of the first trench 01 as a vertical direction, an etching speed of the etching gas in the vertical direction is greater than an etching speed of the etching gas in the horizontal direction. The etching gas etches and removes the bottom wall of the second isolation structure 260 to expose a part of the horizontal portion 251 of the sacrificial structure 250, such that a depth of the first trench 01 is increased to form the third trench 03. The etching gas may be one or two or more of sulfur hexafluoride ($SF_6$), carbon tetrafluoride ($CF_4$), chlorine ($Cl_2$), trifluoromethane ($CHF_3$), oxygen ($O_2$), and bromine (Ar) or a gas mixture thereof.

Step S450: Inject an etching solution into the third trench, and remove the horizontal portion of the sacrificial structure to form an air layer, wherein the air layer communicates with the third trench to form a fourth trench.

As shown in FIG. 33, FIG. 34, and FIG. 35, referring to FIG. 30, FIG. 31, and FIG. 32, the horizontal portion 251 of the sacrificial structure 250 is removed to form an air layer 310. In this embodiment, the horizontal portion 251 of the sacrificial structure 250 is removed through a wet etching process. The etching solution is injected into the third trench 03. The etching solution has a high etch selectivity to a sacrificial material and a second isolation material, and the etching solution has a high etch selectivity to the sacrificial material and a first isolation material. In this embodiment, a hydrofluoric acid solution is used as the etching solution. The hydrofluoric acid solution is injected into the third trench 03. The hydrofluoric acid solution removes the horizontal portion 251 of the sacrificial structure 250 such that the air layer 310 is formed at an original position of the horizontal portion 251 of the sacrificial structure 250. The air layer 310 communicates with the third trench 03 to form a fourth trench 04. As shown in FIG. 33 and FIG. 34, in the vertical direction, a width of the air layer 310 is greater than a width of the third trench 03, and a cross section of the fourth trench 04 is of an "inverted-T" shape.

Step S460: Form a third isolation structure, and fill a part of the fourth trench with the third isolation structure, and form an air chamber.

Figure 37:
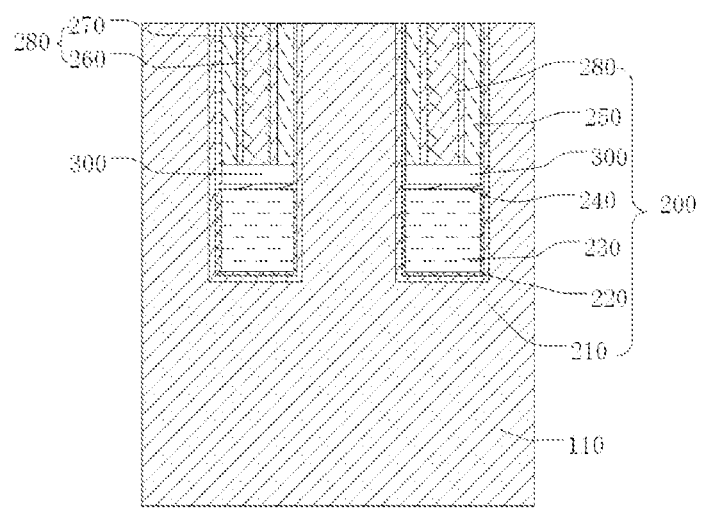
FIG. 37 is a schematic cross-sectional view of FIG. 36 along a direction x.
Figure 38:
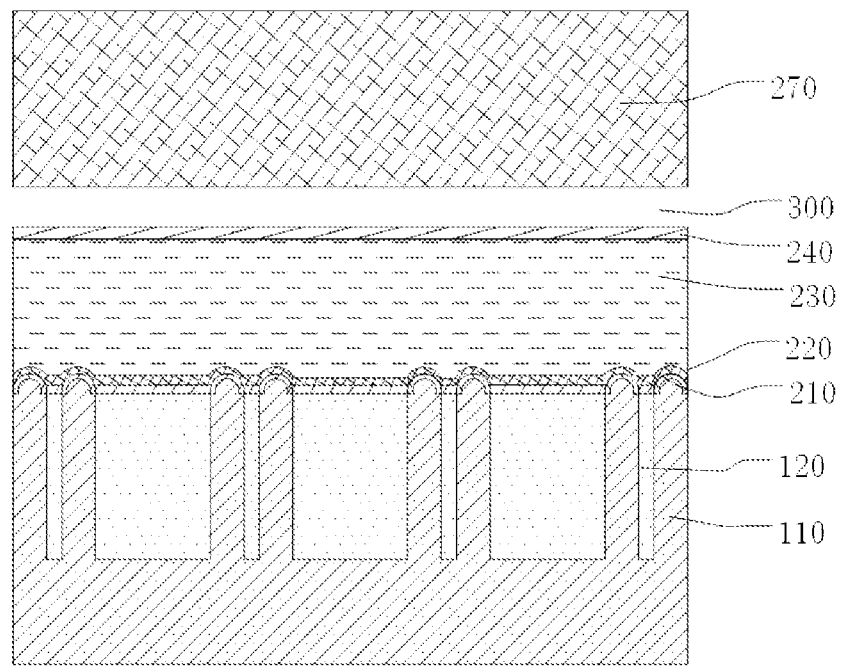
FIG. 38 is a schematic cross-sectional view of the word line structure in FIG. 36 along a direction y.

As shown in FIG. 36, FIG. 37, and FIG. 38, referring to FIG. 33, FIG. 34, and FIG. 35, a third isolation layer material may be deposited through a low pressure chemical vapor deposition (LPCVD) process, to form a third isolation structure 270. The third isolation structure 270 fills a part of the fourth trench 04, to form a closed air chamber 300 at the bottom of the fourth trench 04. The process of depositing the third isolation layer material to fill the fourth trench 04 is affected by the shape of the inner wall of the fourth trench 04. The third isolation layer material first closes the bottom of the third trench 03, and form a closed air chamber 300 at the bottom of the fourth trench 04. The air chamber 300 includes at least an air layer 310 (referring to FIG. 36) formed by removing the horizontal portion 251 of the sacrificial structure 250. The air chamber 300 may further includes a part of the third trench 03 (referring to FIG. 39 or FIG. 41). The third isolation structure 270 and the first intermediate structure 200A form a word line structure 200. The air chamber 300 closed and disposed above the conductive layer 230 is formed in the word line structure 200.

In this embodiment, a horizontal portion of a sacrificial structure is etched and removed by using an etching reagent, to form, in a word line trench, a fourth trench with a cross section of an "inverted-T" shape, such that an air chamber is formed at the bottom of the fourth trench during filling of the fourth trench because the filling process is affected by a shape of an inner wall of the fourth trench, and in a finally formed semiconductor structure, the air chamber is formed above a conductive layer of the word line structure. The air of a low dielectric constant reduces electrical performance of an isolation structure above the conductive layer, thereby further reducing a parasitic capacitance between the word line structure of the semiconductor structure and other conducting wire structures.

Figure 41:
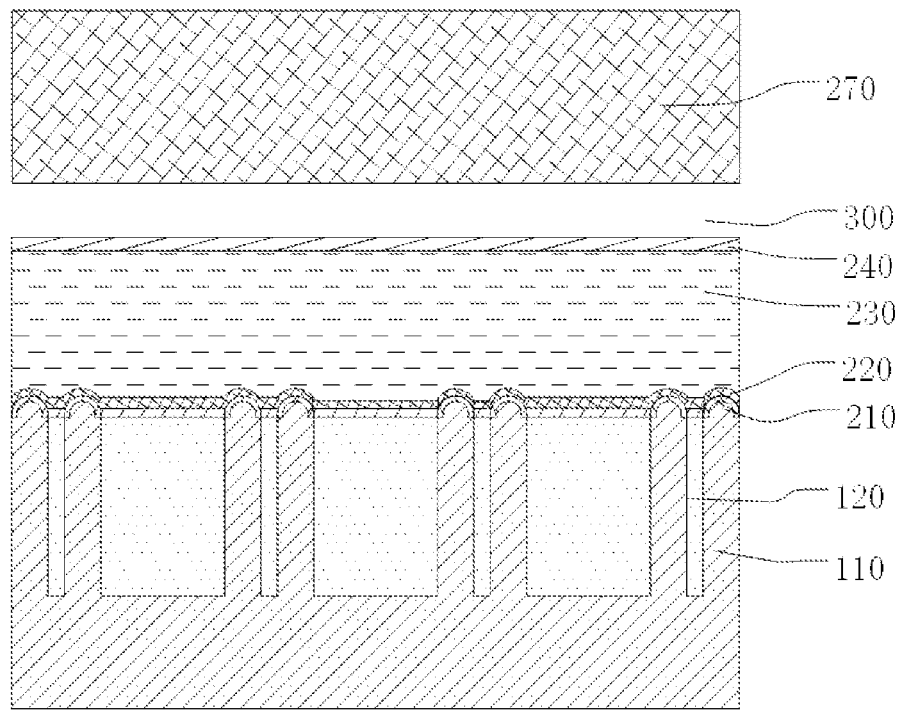
FIG. 41 is a schematic cross-sectional view of the word line structure in FIG. 39 along a direction y.

An exemplary embodiment of the present disclosure provides a semiconductor structure. As shown in FIG. 36, or FIG. 39, or FIG. 41, the semiconductor structure includes: a base 100, a word line trench 130 formed in the base 100, and a word line structure 200 formed in the word line trench 130. The base 100 includes active regions 110 and shallow trench isolation structures 120 separating the active regions 110. The word line trench 130 intersects the active region 110 and the shallow trench isolation structure 120. The word line structure 200 includes a conductive layer 230, a top isolation structure 280, and an air chamber 300. The air chamber 300 is provided between the conductive layer 230 and the top isolation structure 280.

In the semiconductor structure of this embodiment, an air chamber 300 is provided between the conductive layer 230 of the word line structure 200 and the top isolation structure 280 above. The existence of the air chamber 300 changes electrical features of the top isolation structure 280, thereby reducing a parasitic capacitance between the word line structure 200 and other conducting wires of the semiconductor structure, reducing capacitive interference between conductive structures of the semiconductor structure, and improving electrical performance and stability of the semiconductor structure.

As shown in FIG. 36, or FIG. 39, or FIG. 41, the word line structure 200 further includes a gate dielectric layer 210 and a first isolation structure 240. The gate dielectric layer 210 covers a bottom wall and side walls of the word line trench 130. The first isolation structure 240 covers a top surface of the conductive layer 230 and side walls of the gate dielectric layer 210 exposed by the conductive layer 230. The air chamber 300 is provided between the top isolation structure 280 and the first isolation structure 240.

As shown in FIG. 36, or FIG. 39, or FIG. 41, the top isolation structure 280 includes a second isolation structure 260 and a third isolation structure 270, and the air chamber 300 is formed between a bottom surface of the third isolation structure 270 and the first isolation structure 240.

Figure 40:
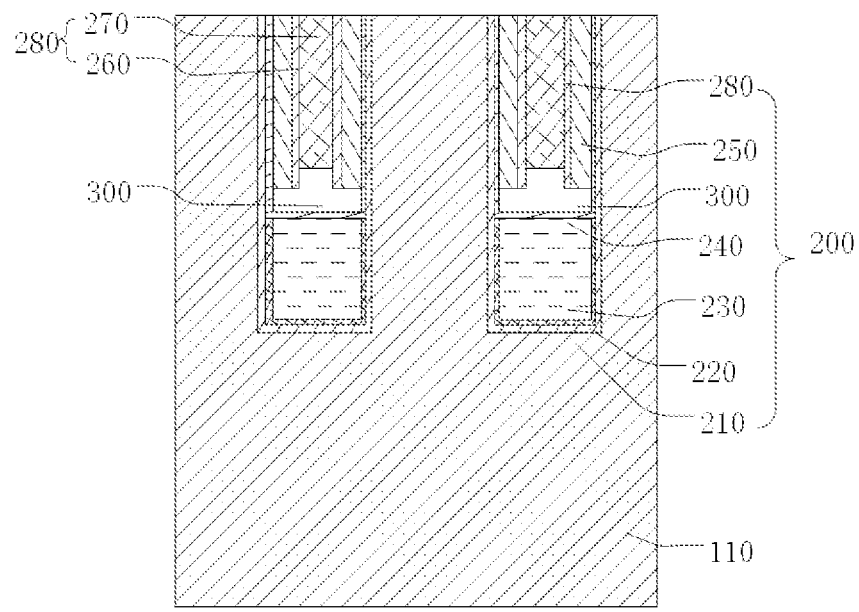
FIG. 40 is a schematic cross-sectional view of FIG. 39 along a direction x.
Figure 42:
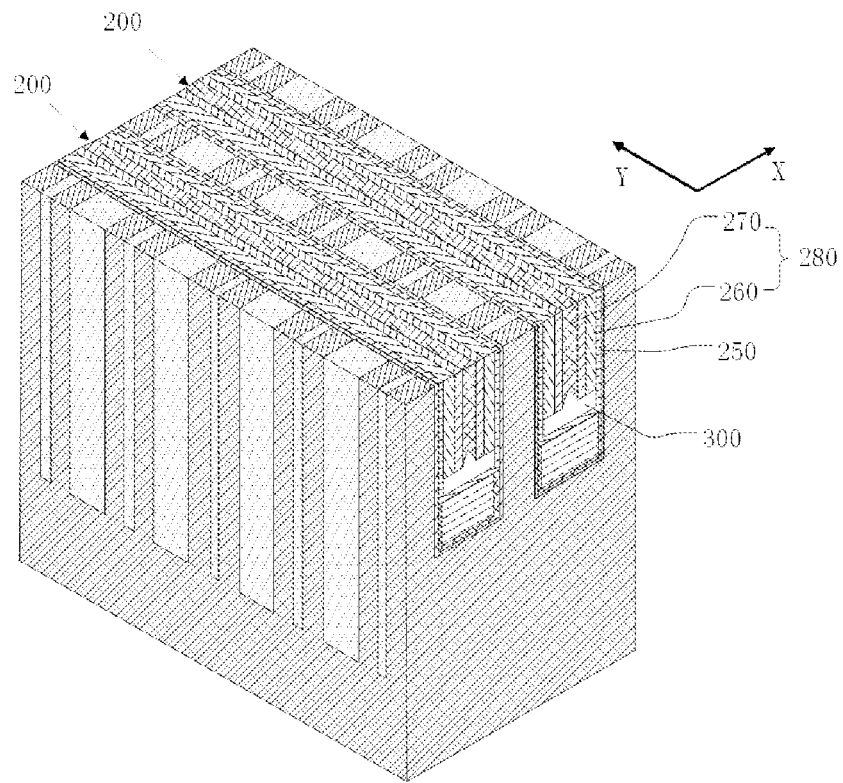
FIG. 42 is a schematic diagram of forming a word line structure in a method of manufacturing a semiconductor structure according to an exemplary embodiment.
Figure 43:
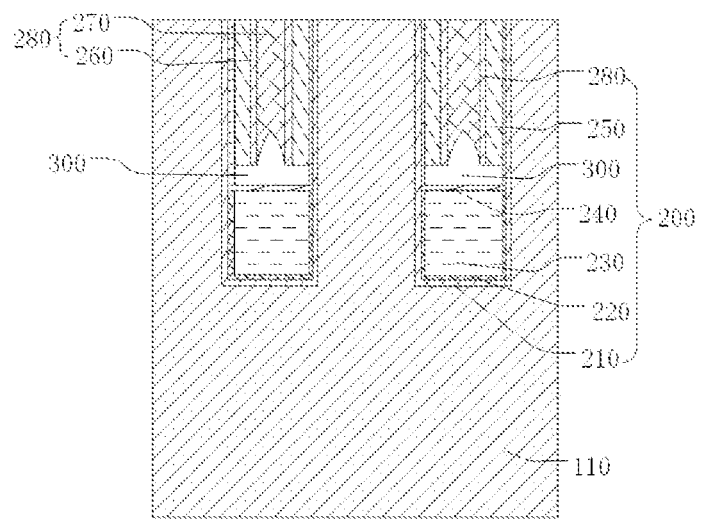
FIG. 43 is a schematic cross-sectional view of FIG. 42 along a direction x.

In this embodiment, referring to FIG. 36, FIG. 37, FIG. 38, the bottom surface of the third isolation structure 270 and a bottom surface of the second isolation structure 260 are at a same height, and a height of the formed air chamber 300 is equal to a height of the bottom surface of the second isolation structure 260. In other embodiments of the present disclosure, as shown in FIG. 39 or FIG. 41, the bottom surface of the third isolation structure 270 is higher than the bottom surface of the second isolation structure 260. For example, referring to FIG. 39, FIG. 40, and FIG. 41, the bottom surface of the third isolation structure 270 is higher than the bottom surface of the second isolation structure 260, and a cross section of the formed air chamber 300 is of an "inverted-T" shape structure. For another example, referring to FIG. 41 and FIG. 42, the bottom surface of the third isolation structure 270 is higher than the bottom surface of the second isolation structure 260, and a cross section of the formed air chamber 300 is of an irregular structure.

In this embodiment, a ratio of a width of the third isolation structure 270 to a width of the word line trench 130 ranges from 0.1 to 0.3.

According to an exemplary embodiment, most content of the bit line structure of this embodiment is the same as that of the foregoing embodiment. A difference between this embodiment and the foregoing embodiment lies in that, as shown in FIG. 36, or FIG. 39, or FIG. 41, the word line structure 200 includes a sacrificial structure 250, the sacrificial structure 250 covers side walls of the first isolation structure 240, the sacrificial structure 250 is provided between the side walls of the first isolation structure 240 and the second isolation structure 260, and the second isolation structure 260 covers the sacrificial structure 250.

According to an exemplary embodiment, most content of the bit line structure in this embodiment is the same as that in the foregoing embodiment, and a difference between this embodiment and the foregoing embodiment lies in that, as shown in FIG. 36, or FIG. 39, or FIG. 41, the word line structure 200 further includes a barrier layer 220, and the barrier layer 220 is provided between the conductive layer 230 and the gate dielectric layer 210, to prevent a material of the conductive layer 230 from penetrating the base 100 to contaminate the base 100 and affect performance of the semiconductor structure.

In the semiconductor structure of this embodiment, the air chamber 300 is provided between the conductive layer 230 and the top isolation structure 280 of the word line structure 200, and the existence of the air chamber 300 affects electrical performance of the top isolation structure 280, thereby further reducing a parasitic capacitance between the word line structure 200 and other conducting wire structures of the semiconductor structure, and improving electrical performance and stability of the semiconductor structure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the method of manufacturing a semiconductor structure and the semiconductor structure provided in the embodiments of the present disclosure, an air chamber is formed above a conductive layer of the semiconductor structure, thereby reducing a parasitic capacitance between conducting wires of the semiconductor structure, reducing interference between the conducting wires caused by the parasitic capacitance, and improving electrical performance and stability of the semiconductor structure.

The invention claimed is:

1. A method of manufacturing a semiconductor structure, comprising:
providing a base, wherein the base comprises an active region and a shallow trench isolation structure separating the active region, a word line trench is formed in the base, and the word line trench exposes a part of the active region and the shallow trench isolation structure;

forming a gate dielectric layer, wherein the gate dielectric layer covers the bottom wall and the side walls of the word line trench;

forming a conductive layer, wherein the conductive layer covers a bottom wall of the gate dielectric layer, and an upper surface of the conductive layer is lower than an upper surface of the base;

forming a first isolation structure, wherein the first isolation structure covers a top surface of the conductive layer; and depositing a sacrificial structure, wherein the sacrificial structure covers a bottom wall and side walls of the first isolation structure, and the sacrificial structure forms a second trench;

depositing a second isolation structure in the second trench, wherein the second isolation structure covers a bottom wall and side walls of the second trench, and the second isolation structure forms a first trench and the sacrificial structure comprises a horizontal portion; and removing the horizontal portion of the sacrificial structure, and closing the first trench, and forming an air chamber.

2. The method of manufacturing the semiconductor structure according to claim 1, wherein the method of manufacturing the semiconductor structure further comprises:

removing a part of the second isolation structure, and forming a third trench, wherein the third trench exposes a part of the horizontal portion of the sacrificial structure.

3. The method of manufacturing the semiconductor structure according to claim 2, wherein the removing the horizontal portion of the sacrificial structure comprises:

injecting an etching solution into the third trench, and removing the horizontal portion of the sacrificial structure to form an air layer, wherein the air layer communicates with the third trench to form a fourth trench.

4. The method of manufacturing the semiconductor structure according to claim 3, wherein the closing the first trench comprises:

forming a third isolation structure, and filling a part of the fourth trench with the third isolation structure.

5. The method of manufacturing the semiconductor structure according to claim 4, wherein the forming a third isolation structure, and filling a part of the fourth trench with the third isolation structure comprises:

depositing the third isolation structure by using a low-pressure chemical vapor deposition method, wherein the third isolation structure closes the third trench, and forms an air chamber.

6. The method of manufacturing the semiconductor structure according to claim 1, wherein the forming a conductive layer comprises:

forming an initial conductive layer, wherein the initial conductive layer fills the word line trench and covers the gate dielectric layer; and etching back the initial conductive layer to form the conductive layer.

7. The method of manufacturing the semiconductor structure according to claim 1, wherein the providing a base comprises:

providing a substrate;

etching the substrate to form shallow trenches in the substrate, wherein the shallow trenches separate the substrate into a plurality of active regions arranged in an array;

filling each of the shallow trenches to form a shallow trench isolation structure;

forming a first mask layer; and partially removing the active region and the shallow trench isolation structure according to the first mask layer, and forming the word line trench.

8. A semiconductor structure, wherein the semiconductor structure comprises:

a base, wherein the base comprises an active region and a shallow trench isolation structure separating the active region;

a word line trench, wherein the word line trench is formed in the base and intersects the active region and the shallow trench isolation structure; and a word line structure, wherein the word line structure is formed in the word line trench, the word line structure comprises a conductive layer, a top isolation structure, and an air chamber, and the air chamber is arranged between the conductive layer and the top isolation structure;

wherein the word line structure further comprises a gate dielectric layer and a first isolation structure, the gate dielectric layer covers a bottom wall and side walls of the word line trench, the first isolation structure covers a top surface of the conductive layer and a part of side walls of the gate dielectric layer, and an air layer is provided between the top isolation structure and the first isolation structure;

wherein the top isolation structure comprises a second isolation structure and a third isolation structure, and a bottom surface of the third isolation structure is equal to or higher than a bottom surface of the second isolation structure; and wherein the word line structure further comprises a sacrificial structure, the sacrificial structure covers side walls of the first isolation structure, and the second isolation structure covers side walls of the sacrificial structure.

9. The semiconductor structure according to claim 8, wherein the word line structure comprises a barrier layer, and the barrier layer is provided between the conductive layer and the gate dielectric layer.

10. The semiconductor structure according to claim 8, wherein a ratio of a width of the third isolation structure to a width of the word line trench ranges from 0.1 to 0.3.

* * * * *